(12) United States Patent
Shin et al.

(10) Patent No.: US 8,455,317 B2
(45) Date of Patent: Jun. 4, 2013

(54) METHOD FOR FABRICATING SEMICONDUCTOR DEVICE HAVING FIELD EFFECT TRANSISTOR

(75) Inventors: Dongsuk Shin, Yongin-si (KR);
Seongjin Nam, Seongnam-si (KR);
Jung Shik Heo, Seoul (KR); Myungsun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/568,797

(22) Filed: Aug. 7, 2012

(65) Prior Publication Data

US 2012/0302018 A1 Nov. 29, 2012

Related U.S. Application Data

(62) Division of application No. 13/045,100, filed on Mar. 10, 2011, now Pat. No. 8,269,255.

(30) Foreign Application Priority Data

Mar. 12, 2010 (KR) ........................ 10-2010-0022353

(51) Int. Cl.
*H01L 27/00* (2006.01)
(52) U.S. Cl.
USPC ........................................ 438/269; 438/300

(58) Field of Classification Search
USPC .......................................... 438/269, 300, 360
See application file for complete search history.

(56) References Cited

U.S. PATENT DOCUMENTS

| | | | |
|---|---|---|---|
| 5,252,294 A | 10/1993 | Kroy et al. | |
| 5,516,710 A | 5/1996 | Boyd et al. | |
| 6,979,641 B2 | 12/2005 | Hermes | |
| 7,759,199 B2 * | 7/2010 | Thomas et al. | 438/269 |
| 7,772,622 B2 | 8/2010 | Fujimori et al. | |
| 8,269,255 B2 * | 9/2012 | Shin et al. | 257/190 |
| 2005/0148147 A1 | 7/2005 | Keating et al. | |
| 2008/0237742 A1 | 10/2008 | Ranade et al. | |
| 2008/0283906 A1 | 11/2008 | Bohr | |
| 2009/0101942 A1 | 4/2009 | Dyer | |
| 2009/0184341 A1 | 7/2009 | Chong et al. | |
| 2011/0042729 A1 | 2/2011 | Chen et al. | |
| 2011/0042753 A1 | 2/2011 | Jain et al. | |
| 2011/0049567 A1 | 3/2011 | Peng et al. | |

* cited by examiner

*Primary Examiner* — Howard Weiss
*Assistant Examiner* — Steven Rao
(74) *Attorney, Agent, or Firm* — Lee & Morse, P.C.

(57) ABSTRACT

A semiconductor device includes an epitaxial pattern that fills a depression region formed at a semiconductor substrate of one side of a gate pattern. The gate pattern is disposed on a body located at one side of the depression region. The sidewall of the depression region adjacent to the body includes inner surfaces of tapered recesses that taper toward the body, or has an inner surface of a taper recess and a vertical lower sidewall.

13 Claims, 20 Drawing Sheets

METHOD FOR FABRICATING SEMICONDUCTOR DEVICE HAVING FIELD EFFECT TRANSISTOR

CROSS REFERENCE TO RELATED APPLICATION

This is a divisional application based on pending application Ser. No. 13/045,100, filed Mar. 10, 2011, the entire contents of which is hereby incorporated by reference.

BACKGROUND

1. Field

The present disclosure herein relates to a semiconductor device and a method for fabricating the same, and more particularly, to a semiconductor device having a field effect transistor and a method for fabricating the same.

2. Description of the Related Art

Due to the advantages of lightweight, small size and/or low cost, semiconductor devices are widely used in various industry fields such as electronic devices, automobiles and/or ships. A field effect transistor (hereinafter also referred to as a transistor) is an important element constituting a semiconductor device. A transistor may include a source and a drain spaced apart from each other in a semiconductor substrate, and a gate electrode covering the top of a channel region between the source and the drain. The source and the drain may be formed by implanting dopant ions into the semiconductor substrate. The gate electrode may be insulated from the channel region by a gate oxide layer disposed between the semiconductor substrate and the gate electrode. Such a transistor may be used as a single element constituting a switching element and/or a logic circuit in a semiconductor device.

SUMMARY

According to an embodiment, there is provided a semiconductor device including a pair of epitaxial patterns respectively filling a pair of depression regions disposed in a semiconductor substrate and including a semiconductor element different from that of the semiconductor substrate, and a gate pattern disposed on a body that is a portion of the semiconductor substrate located between the pair of the depression regions. With respect to each depression region, a sidewall of the depression region adjacent to the body may include an inner surface of a first tapered recess that tapers toward the body, and an inner surface of a second tapered recess that tapers toward the body. The second tapered recess may be disposed under the first tapered recess, and the epitaxial pattern may fill the first and second tapered recesses.

The inner surface of the first tapered recess may include a first upper inclined surface and a first lower inclined surface located under the first upper inclined surface, and the inner surface of the second tapered recess may include a second upper inclined surface and a second lower inclined surface located under the second upper inclined surface. The first and second upper inclined surfaces may have a downward slope toward the body, and the first and second lower inclined surfaces may have an upward slope toward the body. Crystal planes of the first and second upper inclined surfaces and crystal planes of the first and second lower inclined surfaces may be included in {111} crystal planes.

A bottom end of the first upper inclined surface may be in contact with a top end of the first lower inclined surface, and a bottom end of the second upper inclined surface may be in contact with a top end of the second lower inclined surface A bottom surface of each of the depression regions may have a (100) crystal plane.

The epitaxial pattern may provide a compressive force to the body.

The epitaxial pattern may provide a tensile force to the body.

A capping semiconductor pattern may be disposed on the epitaxial pattern.

According to an embodiment, there is provided a method for fabricating a semiconductor device including forming a gate pattern on a semiconductor substrate, forming a pair of depression regions respectively in the semiconductor substrate at both sides of the gate pattern such that a portion of the semiconductor substrate between the depression regions is defined as a body, and such that a sidewall of each depression region adjacent to the body includes an inner surface of a first tapered recess that tapers toward the body and includes an inner surface of a second tapered recess that tapers toward the body and that is disposed under the first tapered recess, and forming a pair of epitaxial patterns respectively filling a pair of the depression regions, wherein each epitaxial pattern includes a semiconductor element different from the semiconductor substrate, and each epitaxial pattern fills the respective first and second tapered recesses.

The forming of the depression regions may include forming a pair of preliminary depression regions in the semiconductor substrate at both sides of the gate pattern, such that a sidewall of the preliminary depression region adjacent to the body includes a first surface having a (110) crystal plane and a second surface located under the first surface and having a (110) crystal plane, and such that a first horizontal distance between the first surface and the gate pattern is different from a second horizontal distance between the second surface and the gate pattern, and performing a selective wet etching process on the preliminary depression regions to form the depression regions, wherein the selective wet etching process uses {111} crystal planes of the semiconductor substrate as an etch stop surface.

The inner surface of the first tapered recess may include a first upper inclined surface and a first lower inclined surface located under the first upper inclined surface, the inner surface of the second tapered recess includes a second upper inclined surface and a second lower inclined surface located under the second upper inclined surface, the first and second upper inclined surfaces have a downward slope toward the body, the first and second lower inclined surfaces have an upward slope toward the body, and crystal planes of the first and second upper inclined surfaces and the crystal planes of the first and second lower inclined surfaces are included in {111} crystal planes.

The gate pattern may have a pair of sides defined by a pair of sidewalls and the forming of a pair of the preliminary depression regions may include forming a spacer on both sidewalls of the gate pattern, performing a first anisotropic etching process on the semiconductor substrate at both sides of the gate pattern using the gate pattern and the spacer as an etch mask to form first anisotropically-etched regions, performing an isotropic etching process on the first anisotropically-etched regions to form isotropically-etched regions, and performing a second anisotropic etching process on bottom surfaces of the isotropically-etched regions using the gate pattern and the spacer as an etch mask.

The isotropic etching process may have a substantially identical etch rate with respect to all crystal planes of the semiconductor substrate.

The gate pattern may have a pair of sides defined by a pair of sidewalls and the forming of a pair of the preliminary depression regions may include forming a spacer on both sidewalls of the gate pattern, performing a first anisotropic etching process on the semiconductor substrate at both sides of the gate pattern using the gate pattern and the spacer as an etch mask to form first anisotropically-etched regions, forming a mask spacer covering sidewalls of the first anisotropically-etched regions, and performing a second anisotropic etching process on bottom surfaces of the first anisotropically-etched regions using the gate pattern, the spacer on the sidewall of the gate pattern, and the mask spacer as an etch mask.

According to an embodiment, there is provided a semiconductor device that includes a pair of epitaxial patterns respectively filling a pair of depression regions disposed in a semiconductor substrate and including a semiconductor element different from that of the semiconductor substrate, and a gate pattern disposed on a body that is a portion of the semiconductor substrate located between a pair of the depression regions. With respect to each depression region, a sidewall of the depression region adjacent to the body includes an inner surface of a tapered recess that tapers toward the body, and a lower sidewall located under the tapered recess and having a (110) crystal plane, and the epitaxial pattern fills the tapered recess.

The inner surface of the tapered recess may include an upper inclined surface having a downward slope toward the body, and a lower inclined surface having an upward slope toward the body, and crystal planes of the upper lower inclined surfaces may be included in {111} crystal planes.

A bottom surface of the depression region may have a (100) crystal plane.

A bottom surface of the depression region may have a tapered shape that tapers toward a bottom surface of the semiconductor substrate.

According to an embodiment, there is provided a method for fabricating a semiconductor device that includes forming a gate pattern on a semiconductor substrate, forming a pair of depression regions respectively in the semiconductor substrate at both sides of the gate pattern such that a portion of the semiconductor substrate between the depression regions is defined as a body, and such that a sidewall of each depression region adjacent to the body includes an inner surface of a tapered recess that tapers toward the body and includes a lower sidewall located under the tapered recess and having a (110) crystal plane, and forming a pair of epitaxial patterns respectively filling the pair of the depression regions, wherein each epitaxial pattern includes a semiconductor element different from that of the semiconductor substrate, and each epitaxial pattern fills a respective tapered recess.

The forming of the depression regions may include etching the semiconductor substrate at both sides of the gate pattern to form a pair of preliminary first concave regions, performing a selective wet etching process on the preliminary first concave regions to form first concave regions, wherein the selective wet etching process uses {111} crystal planes of the semiconductor substrate as an etch stop surface, and each first concave region includes the tapered recess, and performing an anisotropic etching process on the bottom surfaces of the first concave regions to form second concave regions, such that each of the second concave regions includes a sidewall that is adjacent to the body and has a (110) crystal plane, and such that the sidewall of each second concave region, which sidewall includes the (110) crystal plane, corresponds to the lower sidewall of the depression region.

The method for fabricating a semiconductor device may further include forming a spacer on sidewalls of the gate pattern, wherein the preliminary first concave regions are formed by performing a first anisotropic etching process on the semiconductor substrate using the gate pattern and the spacer as an etch mask, and the second concave regions are formed by performing a second anisotropic etching process on the bottom surfaces of the first concave regions using the gate pattern and the spacer as an etch mask.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
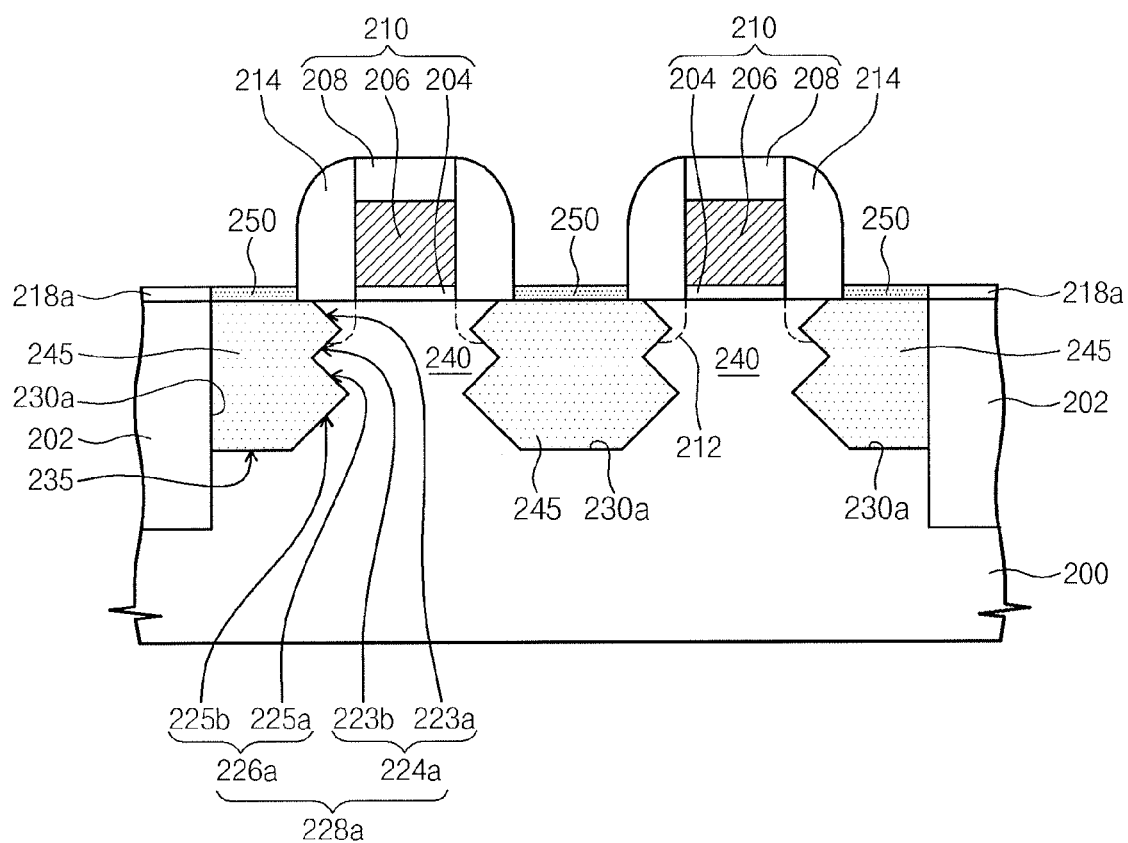
FIG. 1 illustrates a cross-sectional view of a semiconductor device according to an exemplary embodiment.

Korean Patent Application No. 10-2010-0022353, filed on Mar. 12, 2010, in the Korean Intellectual Property Office, and entitled: "Semiconductor Device Having Field Effect Transistor and Method for Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the Embodiment 1

FIG. 1 illustrates a cross-sectional view of a semiconductor device according to an exemplary embodiment of the inventive concept.

Referring to FIG. 1, a device isolation pattern 202 may be disposed to define an active region in a semiconductor substrate 200. The active region corresponds to a portion of the semiconductor substrate 200 surrounded by the device isolation pattern 202. The active region may be doped with first-type dopants. For example, a well region doped with first-type dopants may be disposed in the semiconductor substrate 200. The device isolation pattern 202 may be formed in the well region, and the active region may be doped with the first-type dopants. The semiconductor substrate 200 may have a monocrystalline state. The semiconductor substrate 200 may be a silicon substrate. However, the embodiments are not limited thereto. According to an exemplary embodiment, the semiconductor substrate 200 may be germanium substrate. The device isolation pattern 202 may be a trench-type device isolation pattern. A mask pattern 218a may cover the top of the device isolation pattern 202. The mask pattern 218a may include a dielectric material different from that of the top of the device isolation pattern 202. For example, if the top of the device isolation pattern 202 is formed of oxide, the mask pattern 218a may be formed of nitride and/or oxynitride.

A plurality of epitaxial patterns 245 may respectively fill a plurality of depression regions 230a formed in the active region. The depression regions 230a may be laterally spaced apart from each other. A body 240 may be defined between a pair of depression regions 230a adjacent to each other. The body 240 corresponds to a portion of the active region (i.e., a portion of the semiconductor substrate 200) that is disposed between a pair of the depression regions 230a adjacent to each other. A gate pattern 210 may be disposed on the body 240. As illustrated in FIG. 1, a plurality of gate patterns 210 may be disposed on the active region. In this case, a plurality of bodies 240 corresponding respectively to the gate patterns 210 may be defined in the active region. However, the embodiments are not limited thereto. According to an exemplary embodiment of the inventive concept, one gate pattern 210 may be disposed on the active region, and a pair of depression regions 230a and a pair of epitaxial patterns 245 may be disposed in the active region.

The depression region 230a may have a sidewall 228a adjacent to the body 240. According to an exemplary embodiment, the sidewall 228a of the depression region 230a may include: an inner surface 224a of a first tapered recess that tapers toward the body 240; and an inner surface 226a of a second tapered recess that tapers toward the body 240. The second tapered recess may be disposed under the first tapered recess. The maximum vertical width of the second tapered recess may be larger than the maximum vertical width of the first tapered recess.

The inner surface 224a of the first tapered recess may include a first upper inclined surface 223a and a first lower inclined surface 223b. The first lower inclined surface 223b may be disposed under the first upper inclined surface 223a. The first upper inclined surface 223a may have a downward slope toward the body 240, and the first lower inclined surface 223b may have an upward slope toward the body 240. A bottom end of the first upper inclined surface 223a may contact a top end of the first lower inclined surface 223b. An end portion of the first tapered recess adjacent to the body 240 may be sharp-edged. The inner surface 224b of the second tapered recess includes a second upper inclined surface 225a and a second lower inclined surface 225b. The second lower inclined surface 225b is disposed under the second upper inclined surface 225a. Like the first upper inclined surface 223a, the second upper inclined surface 225a has a downward slope toward the body 240. Like the first lower inclined surface 223b, the second lower inclined surface 225b has an upward slope toward the body 240. A bottom end of the second upper inclined surface 225a may contact a top end of the second lower inclined surface 225b. An end portion of the second tapered recess adjacent to the body 240 may be also sharp-edged. A bottom end of the first lower inclined surface 223b may be in contact with a top end of the second upper inclined surface 225a.

The first tapered recess and the second tapered recess are not limited to the shaped described above. For example, the end portion of the first tapered recess may have a round convex shape in a direction toward the body 240. The end portion of the second tapered recess may have a round convex shape toward the body 240.

The first upper inclined surface 223a may have a crystal plane. Likewise, the first lower inclined surface 223b, the second upper inclined surface 225a and the second lower inclined surface 225b may also have crystal planes. The crystal planes of the inclined surfaces 223a, 225a, 223b and 225b may be included in one family of crystal planes. The inclined surfaces 223a, 225a, 223b and 225b may be included in {111} crystal planes. For example, the crystal plane of the first upper inclined surface 223a may be symmetrical to the crystal plane of the first lower inclined surface 223b with respect to one axis of the coordinate system, and the first upper and lower inclined surfaces 223a and 223b may be equivalent to each other. Likewise, the crystal plane of the second upper inclined surface 225a may be symmetrical to the crystal plane of the second lower inclined surface 225b with respect to one axis of the coordinate system, and the second upper and lower inclined surfaces 225a and 225b may be equivalent to each other. A bottom surface 235 of the depression region 230a may have a crystal plane. The bottom end of the second lower inclined surface 225b may contact one end of the bottom surface 235.

As described above, the epitaxial pattern 245 may fill the depression region 230a. Accordingly, the epitaxial pattern 245 may also fill the first and second tapered recesses. The epitaxial pattern 245 may be formed of a semiconductor material. The epitaxial pattern 245 may have a monocrystalline state. The epitaxial pattern 245 may include a semiconductor element different from that of the semiconductor substrate 200. Because the epitaxial pattern 245 includes the semiconductor element different from that of the semiconductor substrate 200, the epitaxial pattern 245 may provide a compressive force or a tensile force to a channel region defined in the body 240 under the gate pattern 210. Accordingly, the mobility of carriers generated in the channel region may increase when a field effect transistor operates. This will be described below in detail.

When a field effect transistor including the channel region is a PMOS transistor, the epitaxial pattern 245 may provide a compressive force to the channel region. The mobility of holes generated in the channel region may increase when a compressive force is provided to the channel region. In order to provide a compressive force to the channel region, the epitaxial pattern 245 may be formed of semiconductor elements that have a larger diameter than the semiconductor elements of the semiconductor substrate 200. For example, if the semiconductor substrate 200 is a silicon substrate, the epitaxial pattern 245 may be formed of silicon-germanium or germanium. Accordingly, the epitaxial pattern 245 may provide a compressive force to the channel region. Herein, the first and second tapered recesses may face the body 240. Accordingly, the epitaxial pattern 245 filling the first and second tapered recesses may provide a sufficient compressive force to the channel region in the body 240. In particular, a portion of the epitaxial pattern 245 filling the second tapered recess may provide a sufficient compressive force to a bottom portion of the body 240. Consequently, a uniform and sufficient compressive force may be provided to the channel region.

On the other hand, when a field effect transistor including the channel region is an NMOS transistor, the epitaxial pattern 245 may provide a tensile force to the channel region. The mobility of electrons generated in the channel region may increase when a tensile force is provided to the channel region. In order to provide a tensile force to the channel region, the epitaxial pattern 245 may be formed of semiconductor elements that have a smaller diameter than the semiconductor elements of the semiconductor substrate 200. For example, if the semiconductor substrate 200 is a silicon substrate, the epitaxial pattern 245 may be formed of silicon carbide (SiC). Accordingly, the epitaxial pattern 245 may provide a tensile force to the channel region. As described above, the epitaxial pattern 245 may fill the first and second tapered recesses, thereby providing a uniform and sufficient tensile force to the channel region.

According to an exemplary embodiment, the entire epitaxial pattern 245 may be doped with a second-type dopant. The epitaxial pattern 245 may correspond to a source/drain of a field effect transistor. One of the first-type and second-type dopants may be an n-type dopant and the other may be a p-type dopant. If the field effect transistor is a PMOS transistor, the first-type dopant may be an n-type dopant and the second-type dopant may be a p-type dopant. On the other hand, if the field effect transistor is an NMOS transistor, the first-type dopant may be a p-type dopant and the second-type dopant may be an n-type dopant. A spacer 214 may be disposed at both sidewalls of the gate pattern 210. The spacer 214 may include oxide, nitride and/or oxynitride. A lightly-doped region 212 may be disposed in the body 240 under the spacer 214. The lightly-doped region 212 may be doped with the second-type dopant. The lightly-doped region 212 may contact the epitaxial pattern 245. The dopant concentration in the lightly-doped region 212 may be lower than the dopant concentration in the epitaxial pattern 245. An LDD-type source/drain may be implemented by the lightly-doped region 212 and the epitaxial pattern 245.

The gate pattern 210 may include a gate dielectric layer 204, a gate electrode 206 and a capping dielectric pattern 208 that are sequentially stacked. The gate dielectric layer 204 may include at least one of oxide (e.g., thermal oxide), nitride, oxynitride, and/or high-dielectric material (e.g., metal oxide such as aluminum oxide and hafnium oxide). The gate electrode 206 may include at least one of doped semiconductor (e.g., doped silicon and doped germanium), metal (e.g., tungsten, titanium, and tantalum), conductive metal nitride (e.g., titanium nitride and tantalum nitride), and/or metal-semiconductor compound (e.g., tungsten silicide and cobalt silicide). The capping dielectric pattern 208 may include oxide, nitride, and/or oxynitride.

A capping semiconductor pattern 250 may be disposed on the epitaxial pattern 245. The capping semiconductor pattern 250 may be formed of the same semiconductor elements as the semiconductor substrate 200. For example, if the semiconductor substrate 200 is a silicon substrate, the capping semiconductor pattern 250 may be formed of silicon. The capping semiconductor pattern 250 may contact the top surface of the epitaxial pattern 245. Although not illustrated in FIG. 1, a metal silicide may be disposed on the capping semiconductor pattern 250. The metal silicide may be formed the reaction between the metal and the semiconductor elements in the capping semiconductor pattern 250.

According to the above-described semiconductor device, the sidewall 228a of the depression region 230a adjacent to the body 240 may include the inner surfaces 224a and 226a of the first and second tapered recesses that taper toward the body 240, and the epitaxial pattern 245 fills the first and second tapered recesses. Accordingly, the epitaxial pattern 245 may provide a sufficient compressive or tensile force to the body 240. In particular, a portion of the epitaxial pattern 245 filling the second tapered recess may provide a sufficient compressive or tensile force to a bottom portion of the body 240. Accordingly, a substantially uniform and sufficient compressive or tensile force may be provided to the channel region defined in the body 240. Consequently, the mobility of carriers generated in the channel region may increase. When the mobility of carriers in the channel region increases, the turn-on current of the transistor increases, thus making it possible to implement a semiconductor device that has a high reliability and a high operation speed.

In the above-described embodiment, the entire epitaxial pattern 245 may be doped with the second-type dopant. In an exemplary modification, a portion of the epitaxial pattern 245 may not be doped with the second-type dopant. This will be described below with reference to the drawings. In this exemplary modification, like reference numerals are used to denote like elements with respect to those of the semiconductor device described with reference to FIG. 1.

Figure 2:
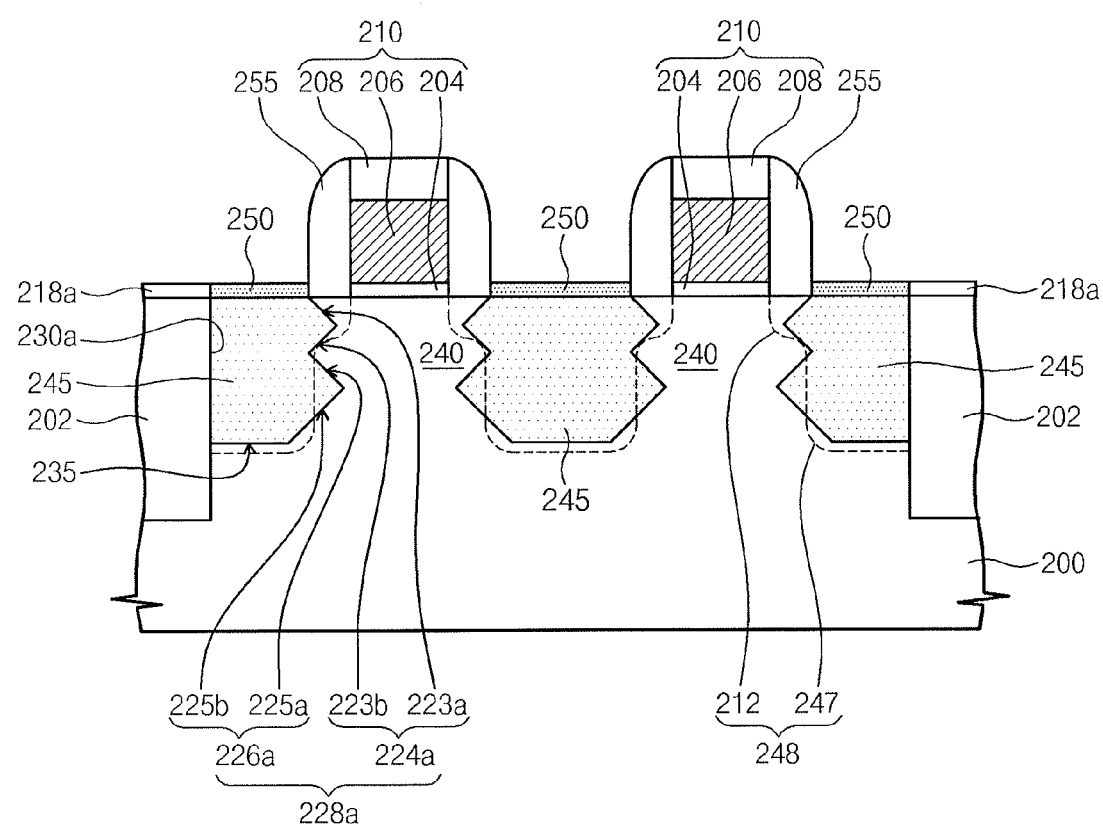
FIG. 2 illustrates a cross-sectional view of an exemplary modification of a semiconductor device according to an exemplary embodiment.

FIG. 2 illustrates a cross-sectional view of an exemplary modification of a semiconductor device according to an exemplary embodiment.

Referring to FIG. 2, a spacer 255 may be disposed at both sidewalls of a gate pattern 210. As described above, a semiconductor substrate 200 may be doped with a first-type dopant. A lightly-doped region 212 may be disposed in a portion of an epitaxial pattern 245 and a portion of a body 240 disposed under the spacer 255. The lightly-doped region 212 may be disposed in a portion of the epitaxial pattern 245 filling a first tapered recess. The lightly-doped region 212 may be doped with a second-type dopant. A heavily-doped region 247 may be disposed in a portion of an active region and a portion of the epitaxial pattern 245 disposed at one side of the spacer 255. The lightly-doped region 212 may be disposed between the heavily-doped region 247 and a channel region. The heavily-doped region 247 contacting the lightly-doped region 212 may be self-aligned with the spacer 255. The heavily-doped region 247 may be doped with the second-type dopant. The dopant concentration in the heavily-doped region 247 may be higher than the dopant concentration in the lightly-doped region 212. The lightly-doped and heavily-doped regions 212 and 24 may constitute a source/drain 248. According to this exemplary modification, a portion of the epitaxial pattern 245 may not be doped with the second-type dopant. For example, a portion of the epitaxial pattern 245 filling the second tapered recess may have an undoped state.

FIGS. 3A to 3F illustrate cross-sectional views relating to a method for fabricating a semiconductor device according to an exemplary embodiment.

Figure 3A:
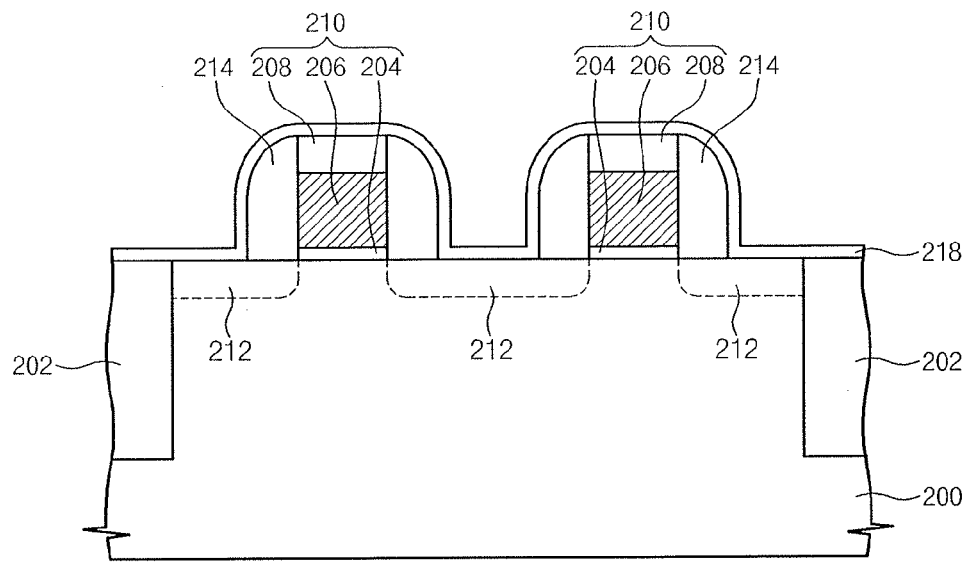
FIGS. 3A to 3F illustrate cross-sectional views relating to a method for fabricating a semiconductor device according to an exemplary embodiment.

Referring to FIG. 3A, a device isolation pattern 202 may be formed in a semiconductor substrate 200 to define an active region. The active region may be doped with a first-type dopant. The device isolation pattern 202 may be a trench-type device isolation pattern. The device isolation pattern 202 may be formed of oxide, nitride, and/or oxynitride. A gate pattern 210 may be formed on the active region. The gate pattern 210 may include a gate dielectric layer 204, a gate electrode 206 and a capping dielectric pattern 208 that are sequentially stacked.

The gate pattern 210 may be used as an ion implantation mask to implant second-type dopant ions into the active region, thereby forming a lightly-doped region 212. Thereafter, a spacer layer may be formed on the semiconductor substrate 200 with the gate pattern 210, and a spacer 214 may be formed at both sidewalls of the gate pattern 210 by blanket-anisotropic etching the spacer layer. The spacer layer may be a single layer or a multiple layer including an oxide layer, a nitride layer and/or an oxynitride layer. A gate oxide process may be performed on the gate pattern 210 before the forming of the spacer layer.

A mask layer 218 may be formed over the semiconductor substrate 200 with the spacer 214. The mask layer 218 may protect the top surface of the device isolation pattern 202. The mask layer 218 may include a dielectric material having an etch selectivity with respect to the top surface of the device isolation pattern 202.

Figure 3B:
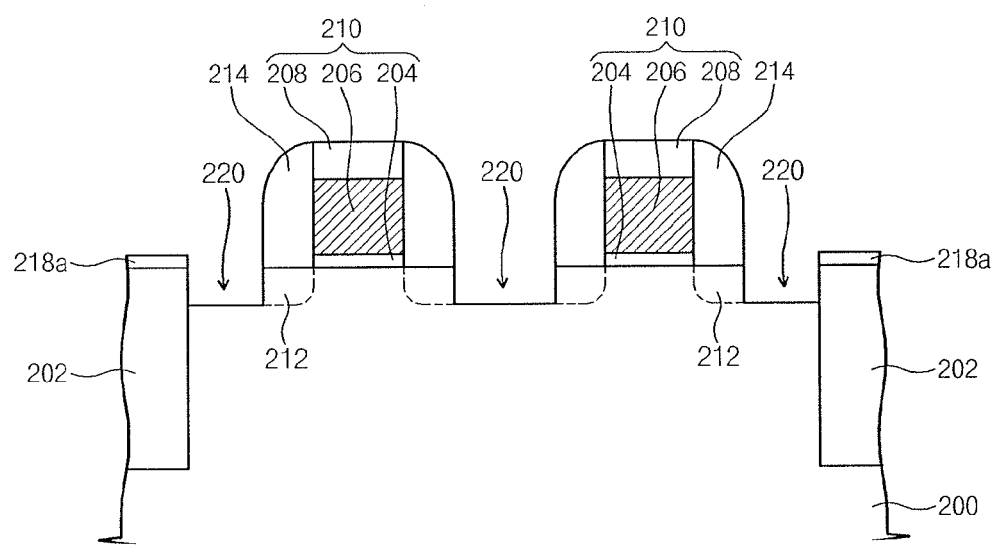

Referring to FIG. 3B, the mask layer 218 may be patterned to form a mask pattern 218a. The mask pattern 218a may cover the top surface of the device isolation pattern 202. Herein, the active region at both sides of the gate pattern 210 may be exposed.

The gate pattern 210, the spacer 214 and the mask pattern 218a may be used as an etch mask to perform a first anisotropic etching process on the exposed active region, thereby forming first anisotropically-etched regions 220 in the active region at both sides of the gate pattern 210. The gate pattern 210 and the spacer 214 at both sidewalls of the gate pattern 210 may be disposed on the active region between a pair of first anisotropically-etched regions 220 adjacent to each other. The first anisotropic etching process may have a substantially identical etch rate with respect to all the crystal planes of the semiconductor substrate 200. The first anisotropic etching process may be a dry etching process.

Figure 3C:
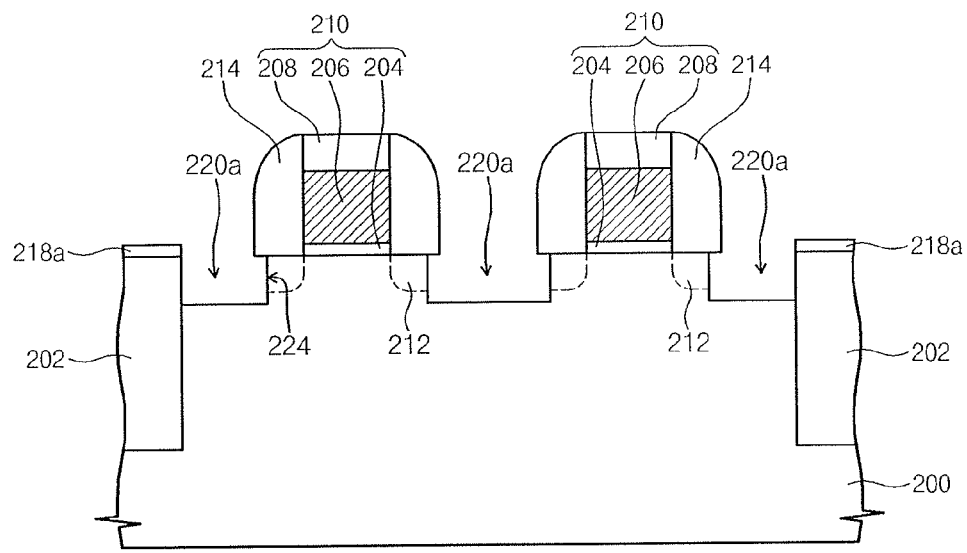

Referring to FIG. 3C, the gate pattern 210, the spacer 214 and the mask pattern 218a may be used as an etch mask to perform an isotropic etching process on the first anisotropically-etched regions 220, thereby forming a pair of isotropically-etched regions 220a in the active region at both sides of the gate pattern 210. The isotropic etching process may have substantially the same etch rate with respect to all the crystal planes of the semiconductor substrate 200. Accordingly, the crystal plane of a sidewall 224 of the isotropically-etched region 220a adjacent to the gate pattern 210 may be the same as the crystal plane of the sidewall of the first anisotropically-etched region 220. The sidewall 224 of the isotropically-etched region 220a may have a (110) crystal plane. A portion of the isotropically-etched region 220a may be disposed under the spacer 214. The sidewall 224 of the isotropically-etched region 220a may be disposed under the spacer 214, and the spacer 214 may cover a portion of the bottom surface of the isotropically-etched region 220a. For example, if the semiconductor substrate 200 is a silicon substrate, the isotropic etching process may be an isotropic dry etching process that uses process gas including NF3 gas.

Figure 3D:
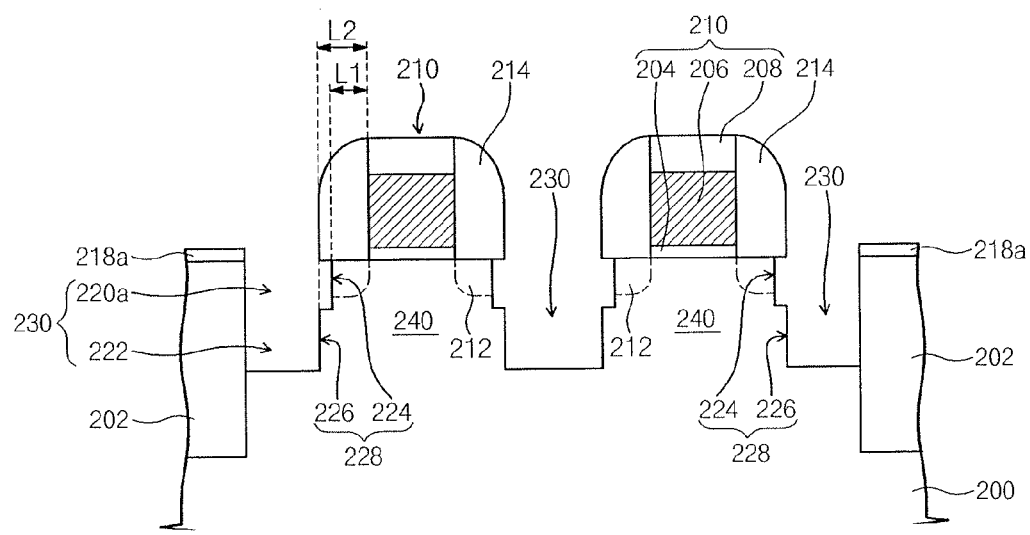

Referring to FIG. 3D, the gate pattern 210, the spacer 214 and the mask pattern 218a may be used as an etch mask to perform a second anisotropic etching process on the bottom surfaces of the isotropically-etched regions 220a, thereby forming second anisotropically-etched regions 222 under the isotropically-etched regions 220a. The second anisotropic etching process is not performed on a portion of the bottom surface of the isotropically-etched region 220a covered by the spacer 214. The isotropically-etched region 220a and the second anisotropically-etched region 222 under the isotropically-etched region 220a may constitute a preliminary depression region 230. The second anisotropic etching process may have substantially the same etch rate with respect to all the crystal planes of the semiconductor substrate 200.

A body 240 is defined between a pair of preliminary depression regions 230 adjacent to both sides of the gate pattern 210. The body 240 corresponds to a portion of the active region disposed between a pair or the preliminary depression regions 230. The preliminary depression region 230 may have a sidewall 228 adjacent to the body 240. The sidewall 228 of the preliminary depression region 230 may include a first surface 224 and a second surface 226. The first surface 224 of the sidewall 228 may have a (110) crystal plane. The first surface 224 may correspond to the sidewall 224 of the isotropically-etched region 220a. The second surface 226 may be disposed under the first surface 224 and may have a (110) crystal plane. The second surface 226 of the sidewall 228 may correspond to the sidewall of the second anisotropically-etched region 22 adjacent to the body 240.

A first horizontal distance L1 between the first surface 224 and the gate pattern 210 may be different from a second horizontal distance L2 between the second surface 226 and the gate pattern 210. The first surface 224 and the second surface 226 may be laterally spaced apart from each other in a plan view. A first virtual perpendicular line passing through the first surface 224 and being perpendicular to the top surface of the semiconductor substrate 200 may be laterally spaced apart from a second virtual perpendicular line passing through the second surface 226 and being perpendicular to the top surface of the semiconductor substrate 200. The first horizontal distance L1 may be smaller than the second horizontal distance L2.

Figure 3E:
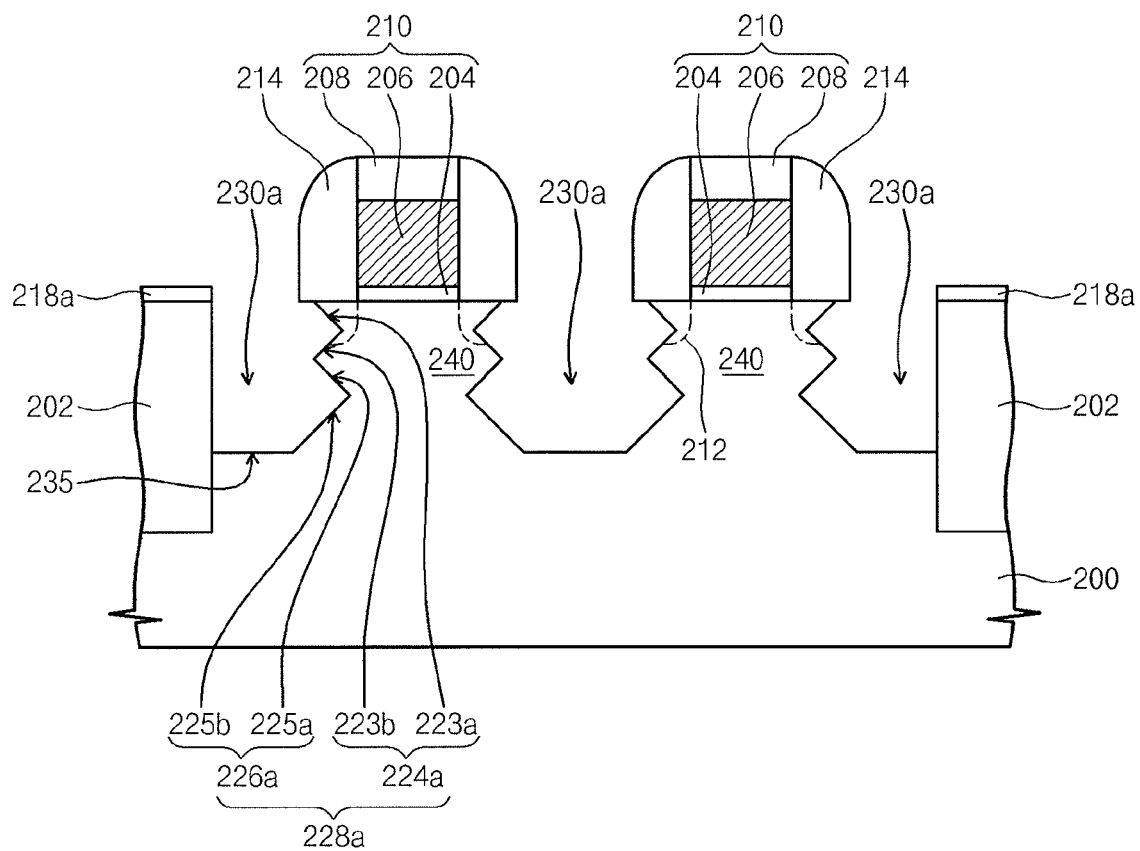

Referring to FIG. 3E, the gate pattern 210, the spacer 214 and the mask pattern 218a may be used as an etch mask to perform a selective wet etching process on the preliminary depression regions 230, thereby forming depression regions 230a. The selective wet etching process may use the crystal planes, selected from the crystal planes of the semiconductor substrate 200, as an etch stop surface. The selective wet etching process may use the {111} crystal planes of the semiconductor substrate 200 as an etch stop surface. The etch rate of the {111} crystal planes by the selective wet etching process may be much lower than the etch rate of the other crystal planes by the selective wet etching process. The first surface 224 of the sidewall 228 of the preliminary depression region 230 may be laterally recessed by the selective wet etching process, and may be etch-stopped at the {111} crystal planes. A first tapered recess of the depression region 230a may be formed. An inner surface 224a of the first tapered recess may include a first upper inclined surface 223a and a first lower inclined surface 223b that are used as etch stop surfaces. The crystal planes of the first upper and lower inclined surface 223a and 223b may be included in the {111} crystal planes. Likewise, the second surface 226 of the sidewall 228 of the preliminary depression region 230 may be laterally recessed by the selective wet etching process, and may be etch-stopped at the {111} crystal planes. A second tapered recess of the depression region 230a may be formed. An inner surface 226a of the second tapered recess may include a second upper inclined surface 225a and a second lower inclined surface 225b that are used as etch stop surfaces. The crystal planes of the second upper and lower inclined surface 225a and 225b may be included in the {111} crystal planes.

The bottom surface of the preliminary depression region 230 may be etched by the selective wet etching process, and may be etch-stopped at the {111} crystal planes. The area of the bottom surface 235 of the depression region 230a may be smaller than the bottom surface of the preliminary depression region 230.

The etch stop surface created by the etching of the bottom surface of the preliminary depression region 230 may be connected to the second lower inclined surface 225b. The bottom surface 235 of the depression region 235a may have a (100) crystal plane. If the semiconductor substrate 200 is a silicon substrate, the selective wet etching process may use an anisotropic etchant including ammonium hydroxide ($NH_4OH$) and/or tetramethyl ammonium hydroxide (TMAH).

Figure 3F:
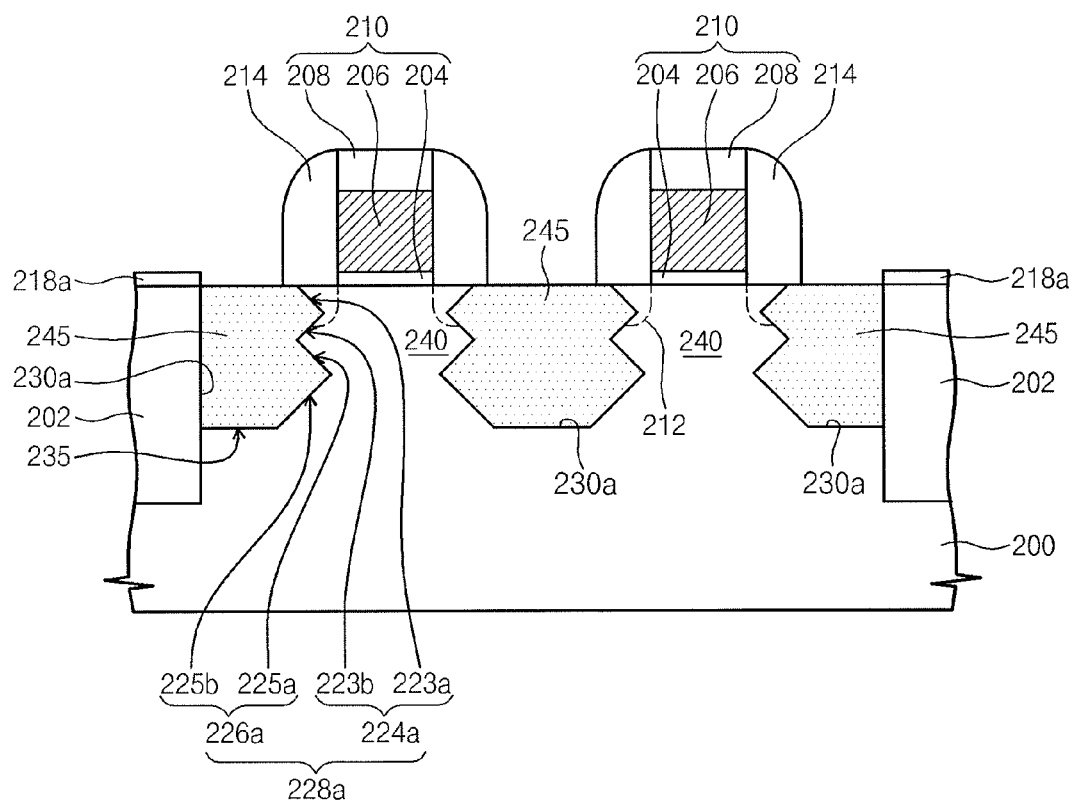

Referring to FIG. 3F, an epitaxial growth process may be performed on the semiconductor substrate 200 with the depression regions 230a to form epitaxial patterns 245 filling the depression regions 230a respectively. The epitaxial patterns 245 may include a semiconductor element different from that of the semiconductor substrate 200. The epitaxial patterns 245 may be doped with second-type dopants. The epitaxial patterns 245 may be doped in situ. The epitaxial patterns 245 may have a higher dopant concentration than the lightly-doped region 212.

Thereafter, a capping semiconductor pattern 250 of FIG. 1 may be formed on the epitaxial pattern 245. Accordingly, the semiconductor device of FIG. 1 may be provided. The capping semiconductor pattern 250 may be formed through a selective epitaxial growth process.

In an exemplary modification, the preliminary depression region 230 may be formed through another process. This will be described below with reference to the drawings. This exemplary modification may include the processes described with reference to FIG. 3.

FIGS. 4A to 4D illustrate cross-sectional views relating to an exemplary modification of a method for fabricating a semiconductor device according to an exemplary embodiment of the inventive concept.

Figure 4A:
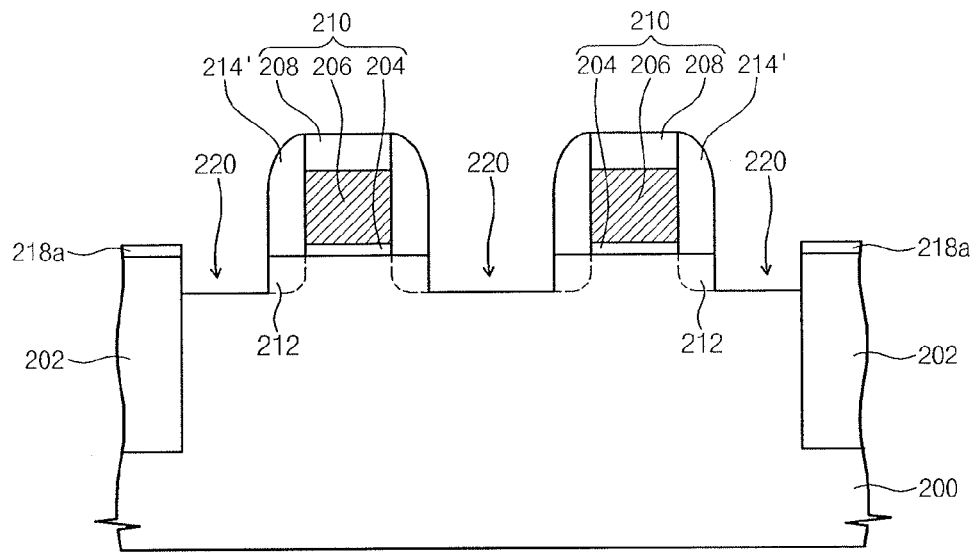
FIGS. 4A to 4D illustrate cross-sectional views relating to an exemplary modification of a method for fabricating a semiconductor device according to an exemplary embodiment.

Referring to FIG. 4A, a gate pattern 210, a spacer 214' and a mask pattern 218a may be used as an etch mask to perform a first anisotropic etching process on an active region at both sides of the gate pattern 210. Accordingly, first anisotropically-etched regions 220 may be formed in the active region at both sides of the gate pattern 210.

Figure 4B:
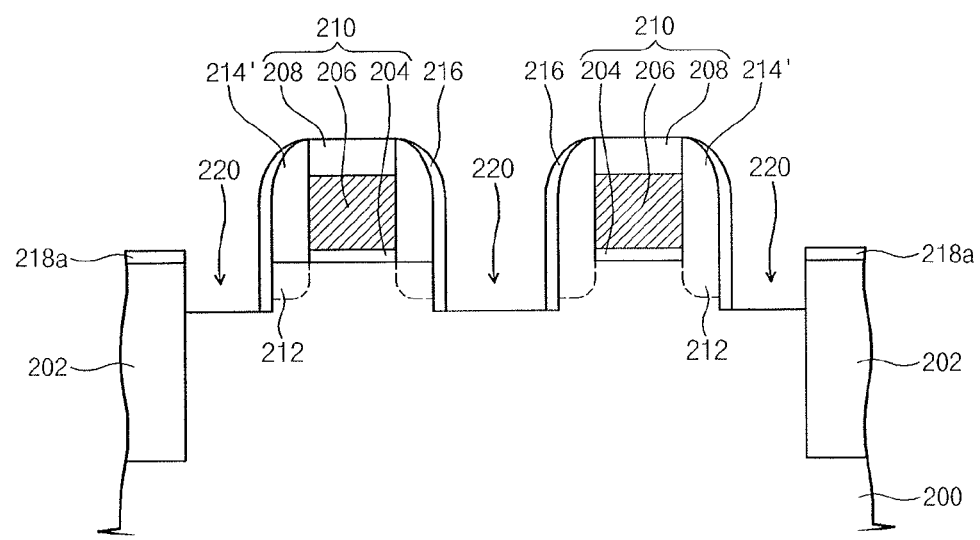

Referring to FIG. 4B, a mask spacer 216 may be formed to cover the sidewalls of the first anisotropically-etched regions 220. The mask spacer 216 may cover a portion of the bottom surface of the first anisotropically-etched region 220. The other portion of the bottom surface of the first anisotropically-etched regions 220, located beside the mask spacer 216, may be exposed. For the convenience of description, the mask spacer 216 is not illustrated on the sidewall of the first anisotropically-etched region 220 adjacent to a device isolation pattern 202 in FIG. 4B. However, the embodiments are not limited thereto. The mask spacer 216 may also be formed on the sidewall of the first anisotropically-etched region 220 adjacent to the device isolation pattern 202. The mask spacer 216 may be formed of a material having an etch selectivity with respect to the spacer 214', a capping dielectric pattern 208, the mask pattern 218a and a semiconductor substrate 200.

Figure 4C:
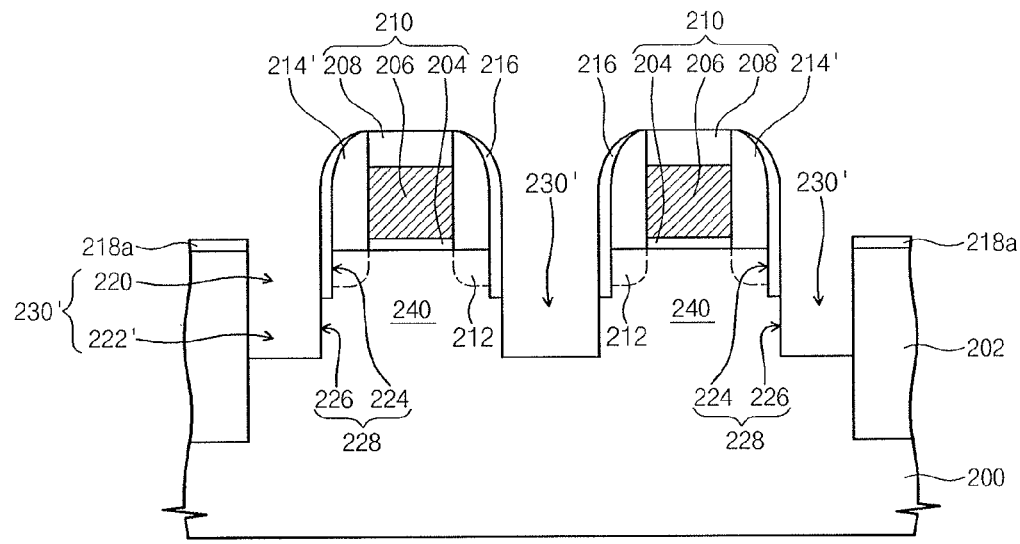

Referring to FIG. 4C, the gate pattern 210, the spacer 214', the mask spacer 216 and the mask pattern 218a may be used as an etch mask to perform a second anisotropic etching process on the bottom surface of the first anisotropically-etched region 220. Accordingly, a second anisotropically-etched region 222' may be formed. The first and second anisotropically-etched regions 220 and 222' constitute a preliminary depression region 230'. A sidewall 228 of the preliminary depression region 230' adjacent to a body 240 may include a first surface 224 and a second surface 226. The first horizontal distance between the first surface 224 and the gate pattern 210 may be different from the second horizontal distance between the second surface 226 and the gate pattern 210.

Figure 4D:
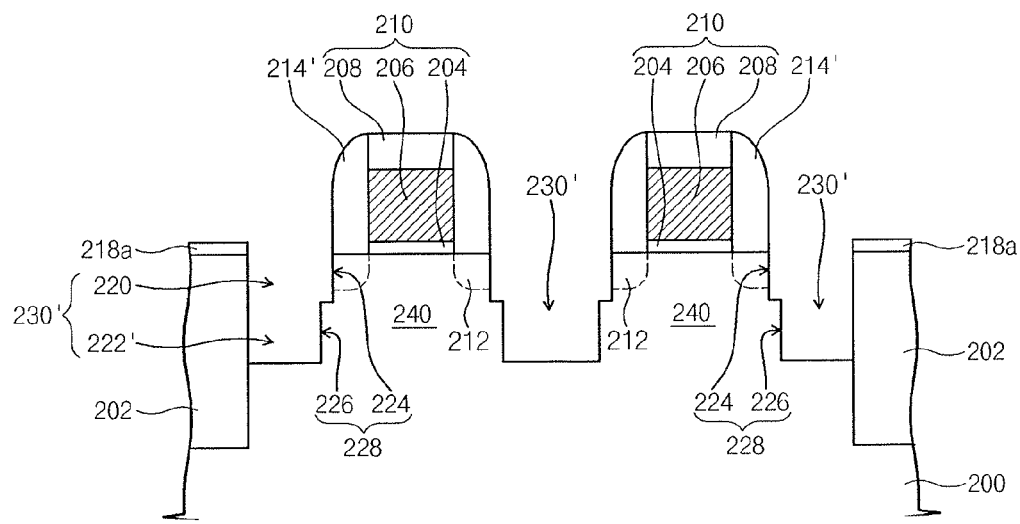

Referring to FIG. 4D, the mask spacer 216 may be removed to the first surface 224 of the sidewall 228 of the preliminary depression region 230'. Thereafter, the selective wet etching process described with reference to FIG. 3E may be performed to depression regions. Thereafter, the processes described with reference to FIG. 3F may be performed.

This exemplary modification does not require the isotropic etching process described with reference to FIG. 3C. Accordingly, the spacer 214' may have a smaller width than the spacer 214 of FIG. 3C. The spacer 214' may be formed of the same material as the spacer 214 of FIG. 3C.

The forming of the source/drain described with reference to FIGS. 3A to 3F may include: forming the lightly-doped region 212 before the forming of the spacer 214; and doping the epitaxial pattern 245 in situ. In another exemplary modification, the source/drain may be formed through another process. This will be described below with reference to the drawings.

FIGS. 5A to 5D illustrate cross-sectional views relating to another exemplary modification of a method for fabricating a semiconductor device according to an exemplary embodiment.

The method for fabricating the semiconductor device according to this exemplary modification may include the processes described with reference to FIGS. 3A to 3E, except the process of forming the lightly-doped region 212.

Figure 5A:
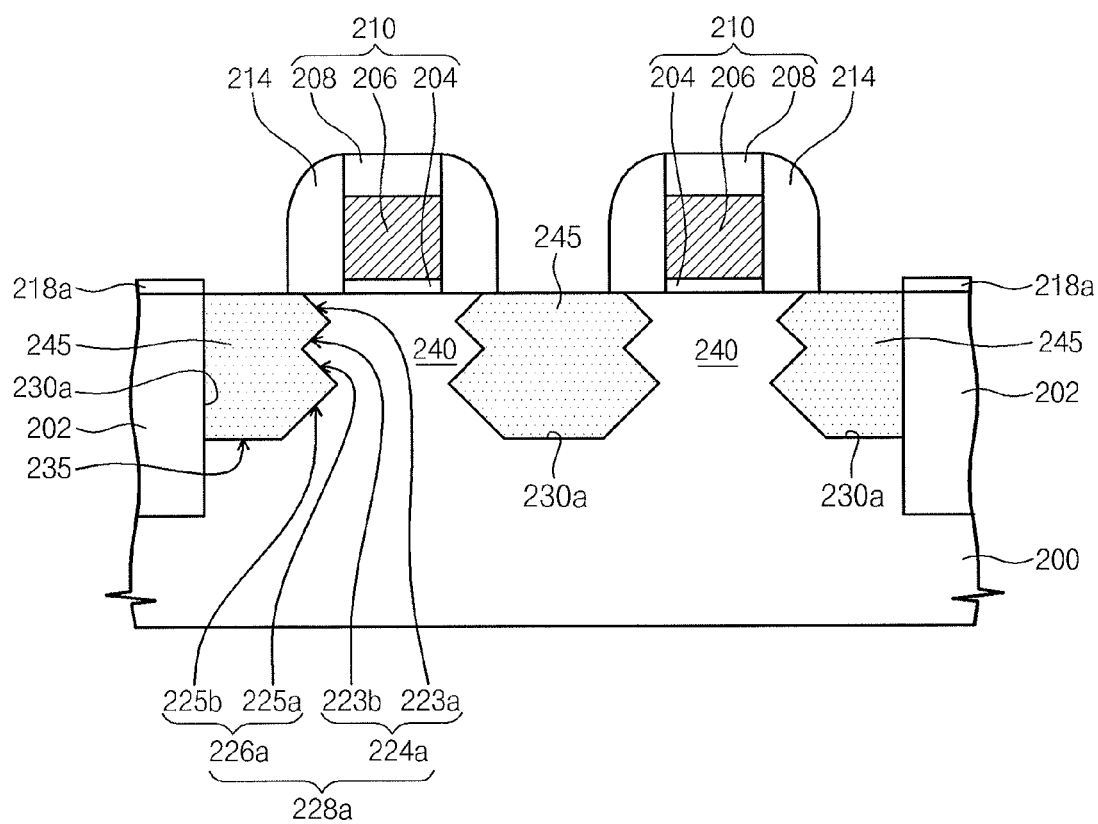
FIGS. 5A to 5D illustrate cross-sectional views relating to another exemplary modification of a method for fabricating a semiconductor device according to an exemplary embodiment.

Referring to FIG. 5A, a selective epitaxial growth process may be performed to form epitaxial patterns 245 filling depression regions 230a respectively. According to this exemplary modification, the epitaxial patterns 245 may have an undoped state.

Figure 5B:
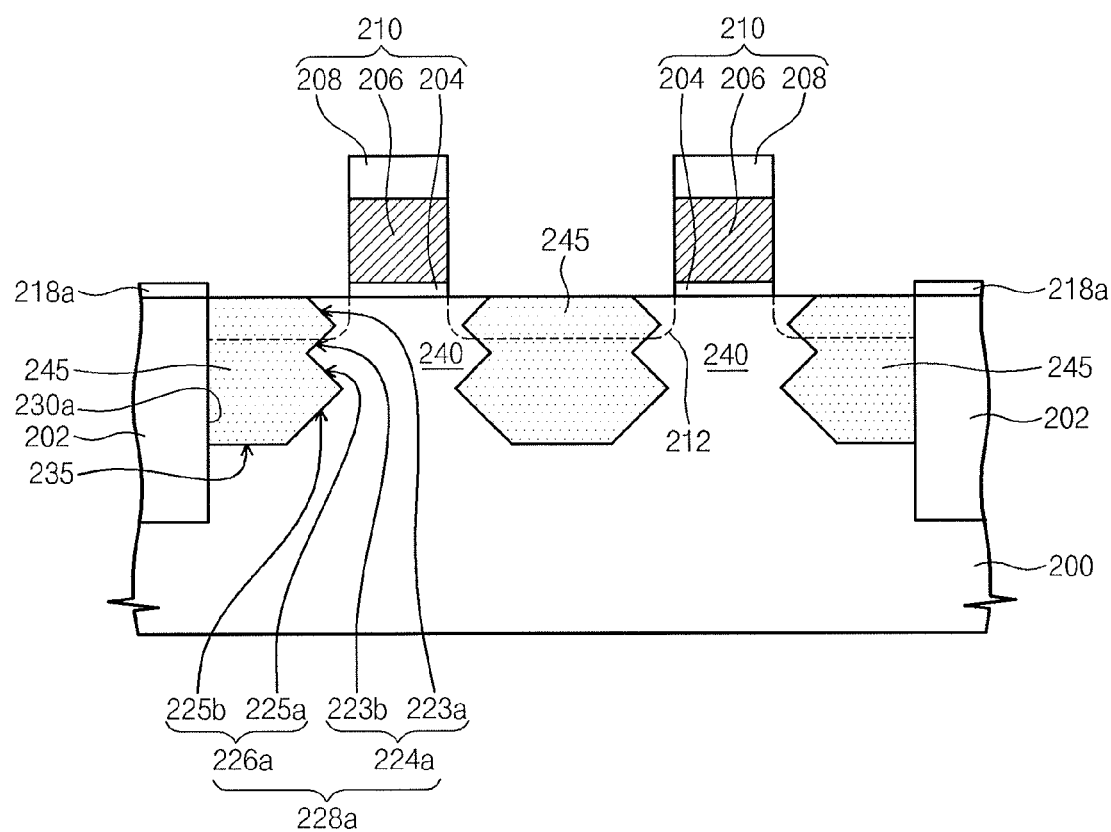

Referring to FIG. 5B, a spacer 214 at both sidewalls of a gate pattern 210 may be removed. Thereafter, the gate pattern 210 may be used as an ion implantation mask to implant first-type dopant ions into the active region and the epitaxial pattern 245, thereby forming a lightly-doped region 212. The lightly-doped region 212 may be formed in a top portion of the active region and a top portion of the epitaxial pattern 245.

Figure 5C:
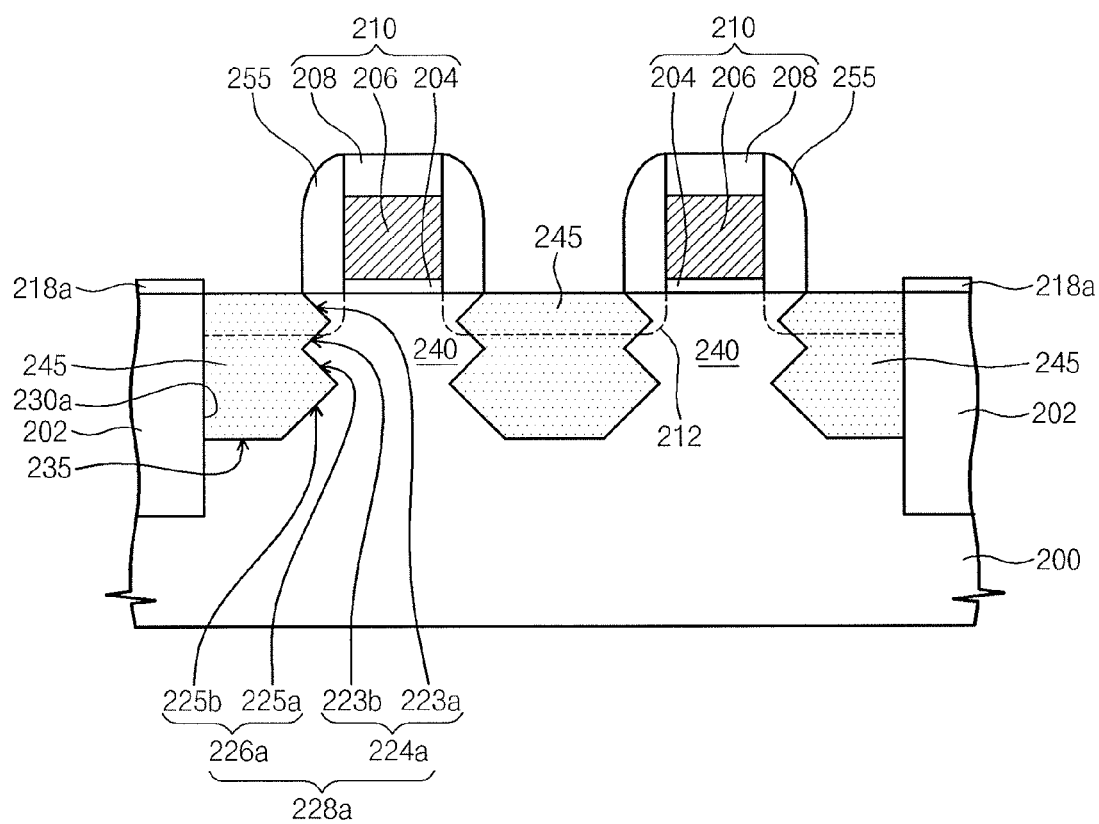
Figure 5D:
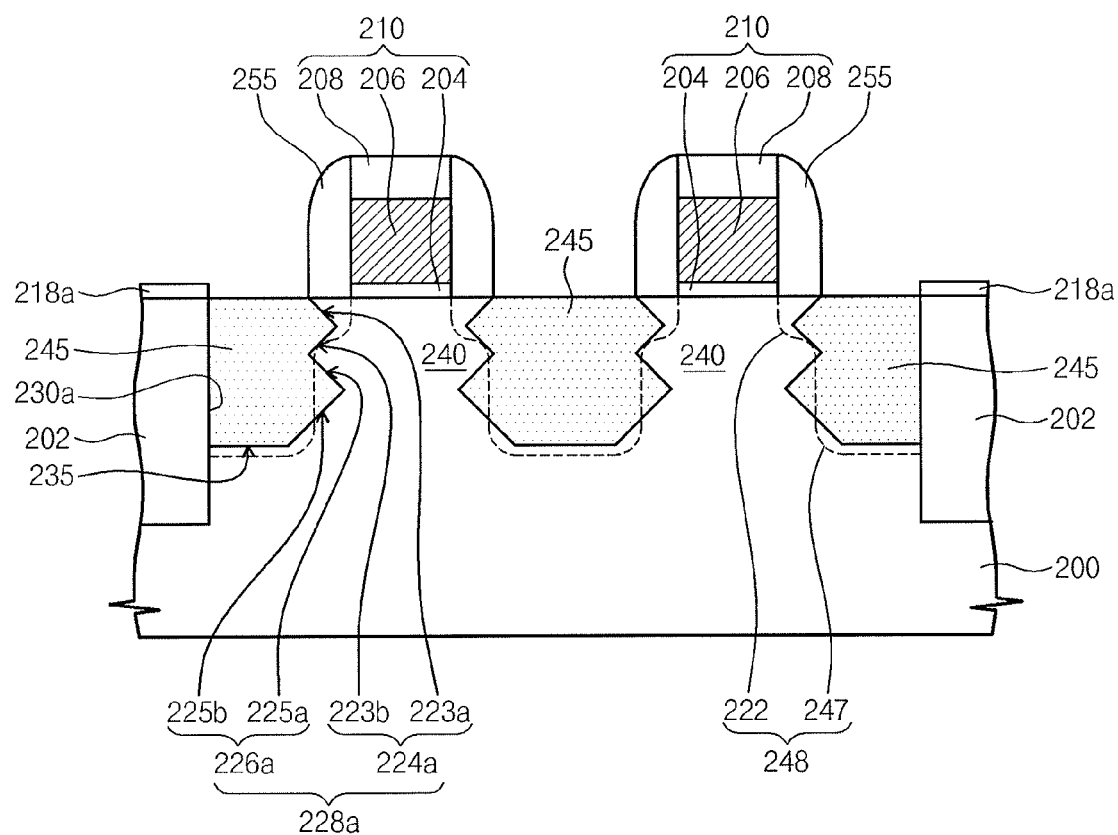

Referring to FIGS. 5C and 5D, a second spacer 255 may be formed on both sidewalls of the gate pattern 210. Thereafter, the gate pattern 210 and the second spacer 255 may be used as an ion implantation mask to implant second-type dopant ions into the active region and the epitaxial pattern 245, thereby forming a heavily-doped region 247. The heavily-doped region 247 may have a higher dopant concentration than the lightly-doped region 212. The lightly-doped and heavily-doped regions 212 and 247 may constitute a source/drain 248.

According to this exemplary modification, after the forming of the undoped epitaxial pattern 245 filling the depression region 230a, the spacer 214 may be removed and the lightly-doped region 212, the second spacer 255 and the heavily-doped region 247 may be sequentially formed. Accordingly, a portion of the epitaxial pattern 245 (e.g., a portion filling a second tapered recess), located under the second spacer 255, may remain in an undoped state. The epitaxial pattern 245 filling the second tapered recess may have an undoped state and may provide a compressive or tensile force to the body 240. Consequently, the punch-trough characteristics between the source/drain can be improved and a sufficient compressive or tensile force may be provided to the channel region.

Embodiment 2

In this embodiment, like reference numerals are used to denote like elements with respect to Embodiment 1.

Figure 6:
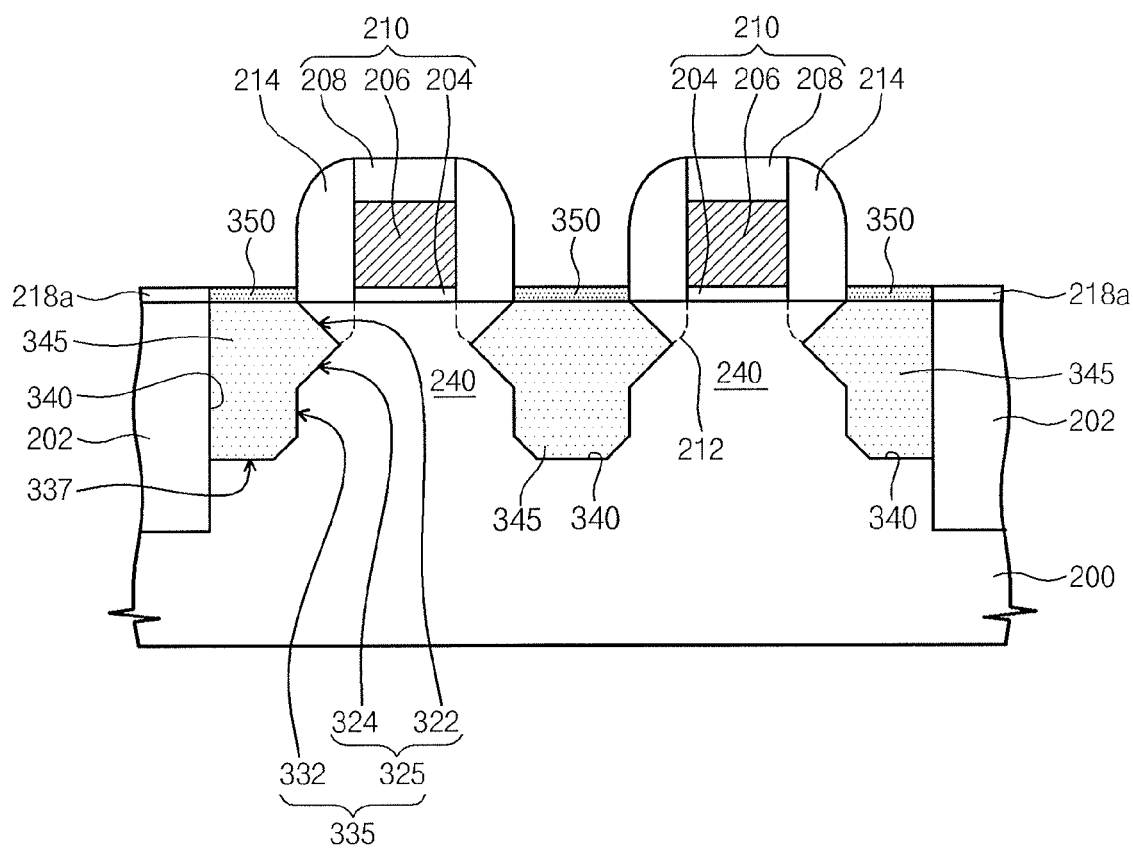
FIG. 6 illustrates a cross-sectional view of a semiconductor device according to another exemplary embodiment.

FIG. 6 illustrates a cross-sectional view of a semiconductor device according to another exemplary embodiment of the inventive concept.

Referring to FIG. 6, a pair of depression regions 340 may be respectively disposed in an active region at both sides of a gate pattern 210, and a pair of epitaxial patterns 345 may respectively fill a pair of the depression regions 340. A body 240 may be defined between a pair of the depression regions 340. The body 240 may correspond to a portion of the active region disposed between a pair of the depression regions 340 adjacent to each other.

According to this embodiment, a sidewall 335 of the depression region 340 adjacent to the body 240 may include: an inner surface 325 of a tapered recess toward the body 240; and a lower sidewall 332 located under the tapered recess. The inner surface 335 of the tapered recess may include an upper inclined surface 322 and a lower inclined surface 324. The upper inclined surface 322 may have a downward slope toward the body 240. The lower inclined surface 324 may be located under the upper inclined surface 322 and may have an upward slope toward the body 240. The crystal planes of the upper and lower inclined surfaces 322 and 324 may be included in {111} crystal planes. A bottom end of the upper inclined surface 322 may be in contact with a top end of the lower inclined surface 324, and an end portion of the tapered recess adjacent to the body 240 may be sharp-edged or rounded. The lower sidewall 332 may have a (110) crystal plane. The top end of the lower sidewall 332 may contact the bottom end of the lower inclined surface 324. A bottom surface 337 of the depression region 340 may have a (100) crystal plane. The bottom end of the lower sidewall 332 may be connected to one end of the bottom surface 337. An inclined edge surface may be disposed between the bottom end of the lower sidewall 332 and one end of the bottom surface 337. The crystal plane of the inclined edge surface may be included in {111} crystal planes.

As described above, the epitaxial pattern 345 may fill the depression region 340. Accordingly, the epitaxial pattern 345 may fill the tapered recess of the depression region 340. The epitaxial pattern 345 may be formed of a semiconductor material. The epitaxial pattern 345 may have a monocrystalline state. The epitaxial pattern 345 may include a semiconductor element different from that of the semiconductor substrate 200. If the epitaxial pattern 345 includes the semiconductor element different from that of the semiconductor substrate 200, the epitaxial pattern 345 may provide a compressive force or a tensile force to a channel region defined in the body 240 under the gate pattern 210. The epitaxial pattern 345 may be formed of the same material as the epitaxial pattern 245 of Embodiment 1. The active region may be doped with a first-type dopant. A portion or the entire of the epitaxial pattern 345 may be doped with a second-type dopant. A source/drain at both sides of the gate pattern 210 may include the entire epitaxial or may be implemented in the same way as the source/drain 248 described with reference to FIG. 2. A capping semiconductor pattern 350 may be disposed on the top surface of the epitaxial pattern 345. The capping semiconductor pattern 350 may be formed of the same material as the capping semiconductor pattern 250 of FIG. 1.

The epitaxial pattern 345 may fill the tapered recess to provide a sufficient compressive or tensile force to a top portion of the body 240. Also, since the lower sidewall 332 may have a (110) crystal plane, is the lower sidewall 332 may be substantially perpendicular to the top surface of the semiconductor substrate 200. Accordingly, the epitaxial pattern 345 may provide a substantially uniform and sufficient compressive and tensile force to a lower portion of the body 240 between the top end and bottom end of the lower sidewall 332.

The bottom surface 337 of the depression region 340 may have a (100) crystal plane. As a modification, the bottom surface of the depression region may have a different shape. This will be described below with reference to the drawings.

Figure 7:
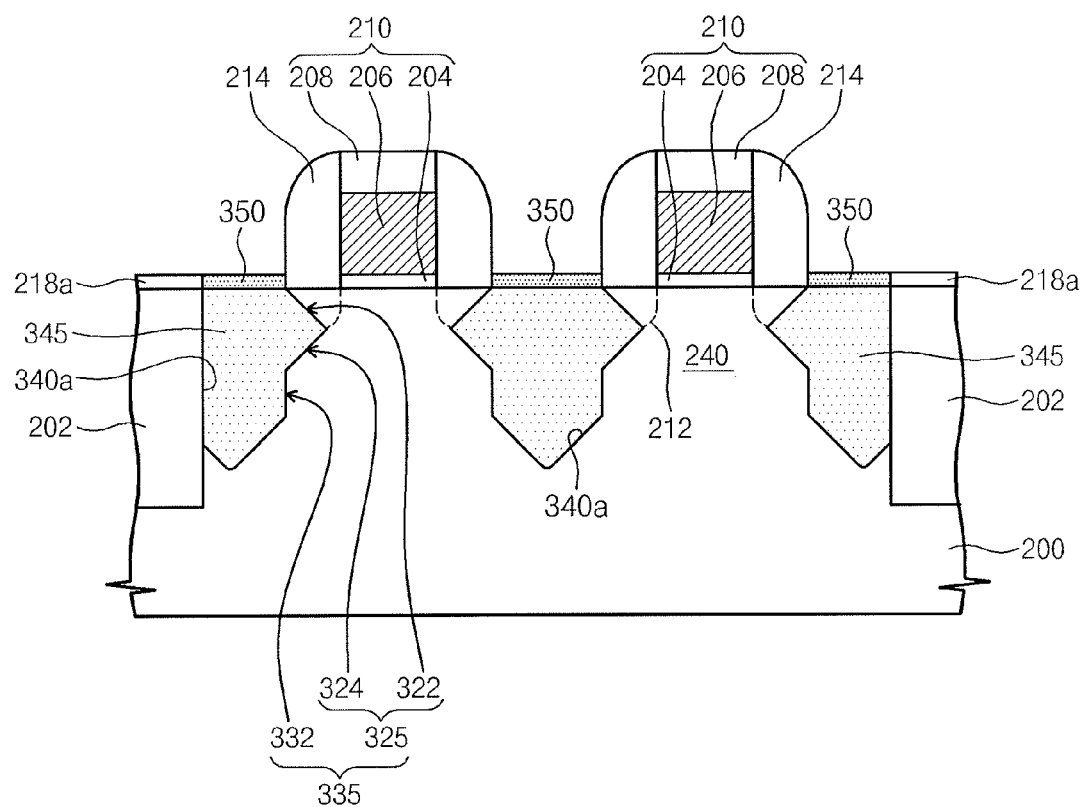
FIG. 7 illustrates a cross-sectional view of an exemplary modification of a semiconductor device according to another exemplary embodiment.

FIG. 7 illustrates a cross-sectional view of an exemplary modification of a semiconductor device according to another exemplary embodiment.

Referring to FIG. 7, a sidewall 335 of a depression region 340a adjacent to a body 240 may have the same shape as described with reference to FIG. 6. However, the bottom surface of the depression region 340a may have a tapered shape that tapers toward the bottom surface of the semiconductor substrate 200. The top surface of a source/drain and a gate pattern 210 may be scaled down, so that the bottom surface of the depression region 340a may have a tapered shape.

FIGS. 8A to 8D illustrate cross-sectional views relating to a method for fabricating a semiconductor device according to another exemplary embodiment of the inventive concept.

Figure 8A:
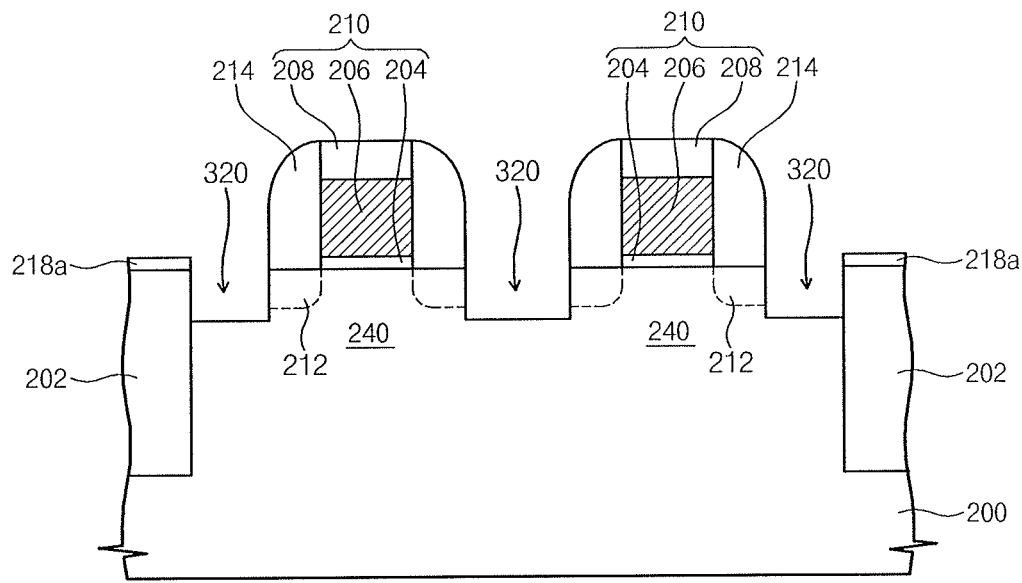
FIGS. 8A to 8D illustrate cross-sectional views relating to a method for fabricating a semiconductor device according to another exemplary embodiment.

Referring to FIG. 8A, preliminary first concave regions 320 may be formed in an active region at both sides of a gate pattern 210. For example, the gate pattern 210, a spacer 214 and a mask pattern 218a may be used as an etch mask to perform a first anisotropic etching process on the active region, thereby forming the preliminary first concave regions 320. The first anisotropic etching process may have a substantially uniform etch rate with respect to all the crystal planes of the semiconductor substrate 200. The gate pattern 210 may be disposed on the body 240 between a pair of the preliminary first concave regions 320.

Figure 8B:
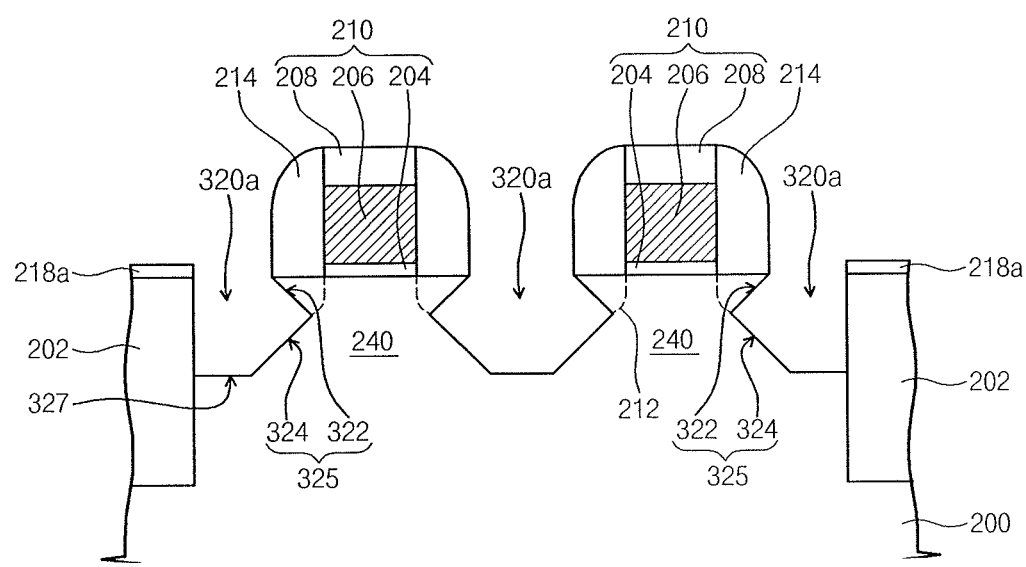

Referring to FIG. 8B, a selective wet etching process may be performed on the preliminary first concave regions 320 to form first concave regions 320a. The selective wet etching process may be the same as the selective wet etching process of Embodiment 1. Accordingly, the sidewall of the preliminary first concave regions 320 may be laterally recessed to form a tapered recess that tapers toward the body 240. The sidewall of the first concave region 320a adjacent to the body 240 may correspond to an inner surface 325 of the tapered recess. When the bottom surface of the preliminary first concave region 320 is etched by the selective wet etching process, the area of a bottom surface 327 of the first concave region 320a may be smaller than the area of the bottom surface of the preliminary first concave region 320.

Figure 8C:
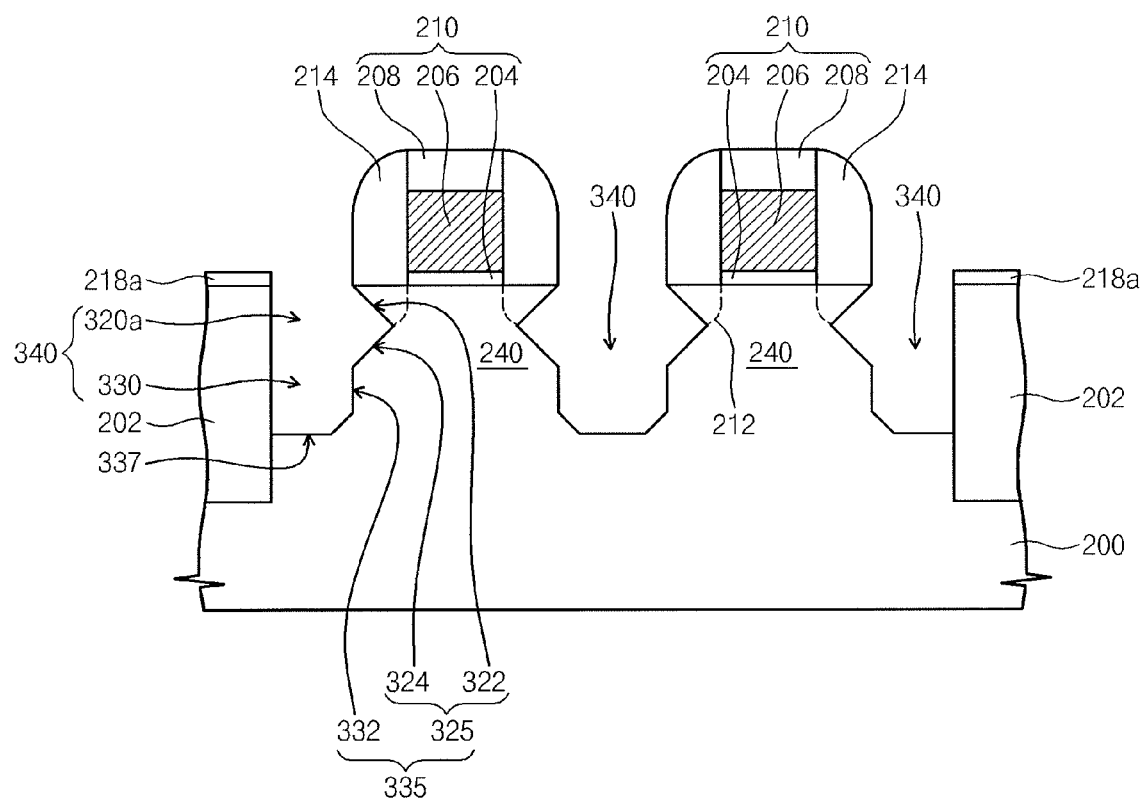

Referring to FIG. 8C, the gate pattern 210, the spacer 214 and the mask pattern 218a may be used as an etch mask to perform a second anisotropic etching process on the bottom surface of the first concave region 320, thereby forming a second concave region 330. The second anisotropic etching process may have a substantially uniform etch rate with respect to all the crystal planes of the semiconductor substrate 200. By the second anisotropic etching process, the second concave region 330 may have a sidewall 324 that is adjacent to the body 240 and may have a (110) crystal plane. The first concave region 320a and the second concave region 330 thereunder constitute a depression region 340. The sidewall 324 of the second concave region 330 may correspond to a lower sidewall 324. The tapered recess of the first concave region 320a may be protected by the spacer 214. When the second concave region 330 is formed by the second anisotropic etching process, the bottom surface of the first concave region 320a may be extended downwardly to form a bottom surface 337 of the depression region 340.

Figure 8D:
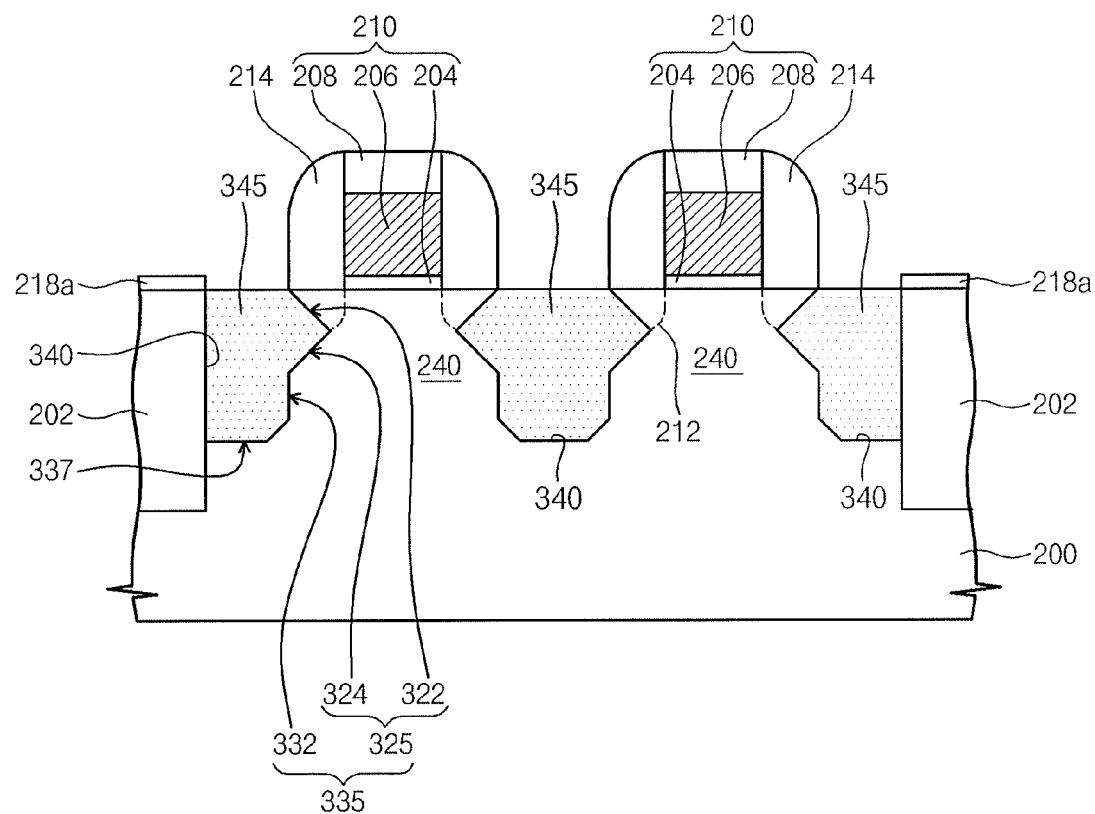

Referring to FIG. 8D, a selective epitaxial growth process may be performed on the semiconductor substrate 200 with the depression regions 340 to form epitaxial patterns 345 filling the depression regions 340 respectively. The epitaxial pattern 345 may be doped in situ so that the entire epitaxial pattern 345 may be doped. The epitaxial pattern 345 may have a higher dopant concentration than a lightly-doped region 112. Thereafter, a capping semiconductor pattern 350 of FIG. 6 may be formed to implement the semiconductor device of FIG. 6. The capping semiconductor pattern 350 may be formed through a selective epitaxial growth process.

The method for forming the source/drain described with reference to FIGS. 5A to 5D may also be applicable to the method for fabricating the semiconductor device described with reference to FIGS. 8A to 8D.

Figure 9A:
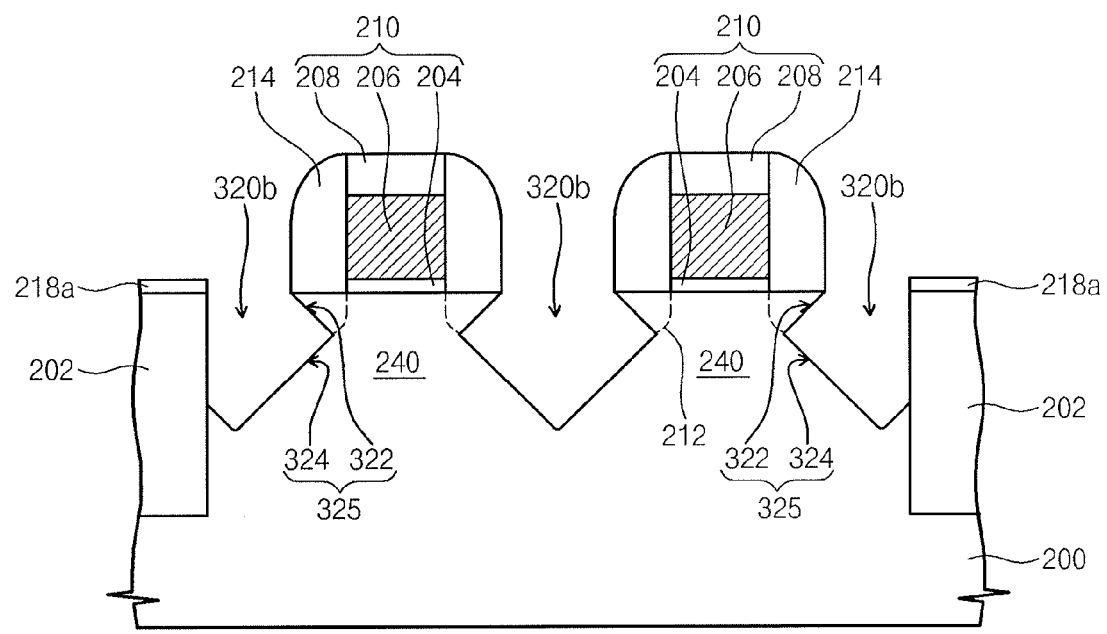
FIGS. 9A to 9C illustrate cross-sectional views relating to an exemplary modification of a method for fabricating a semiconductor device according to another exemplary embodiment.
Figure 9B:
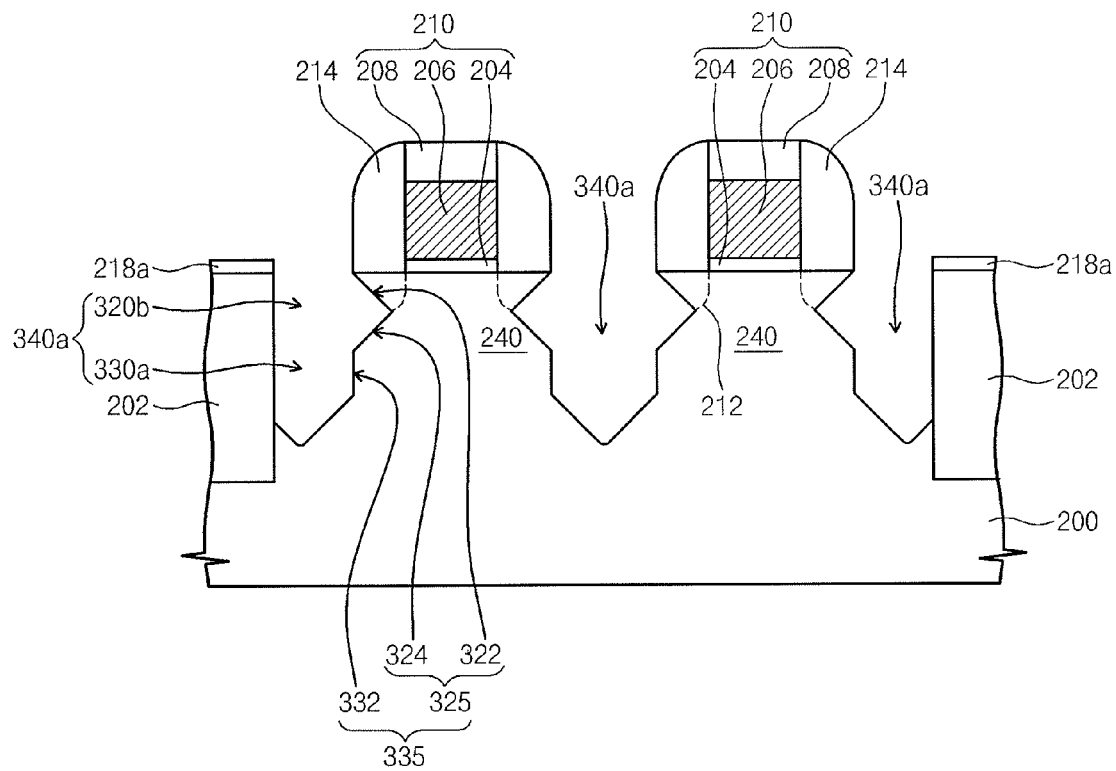
Figure 9C:
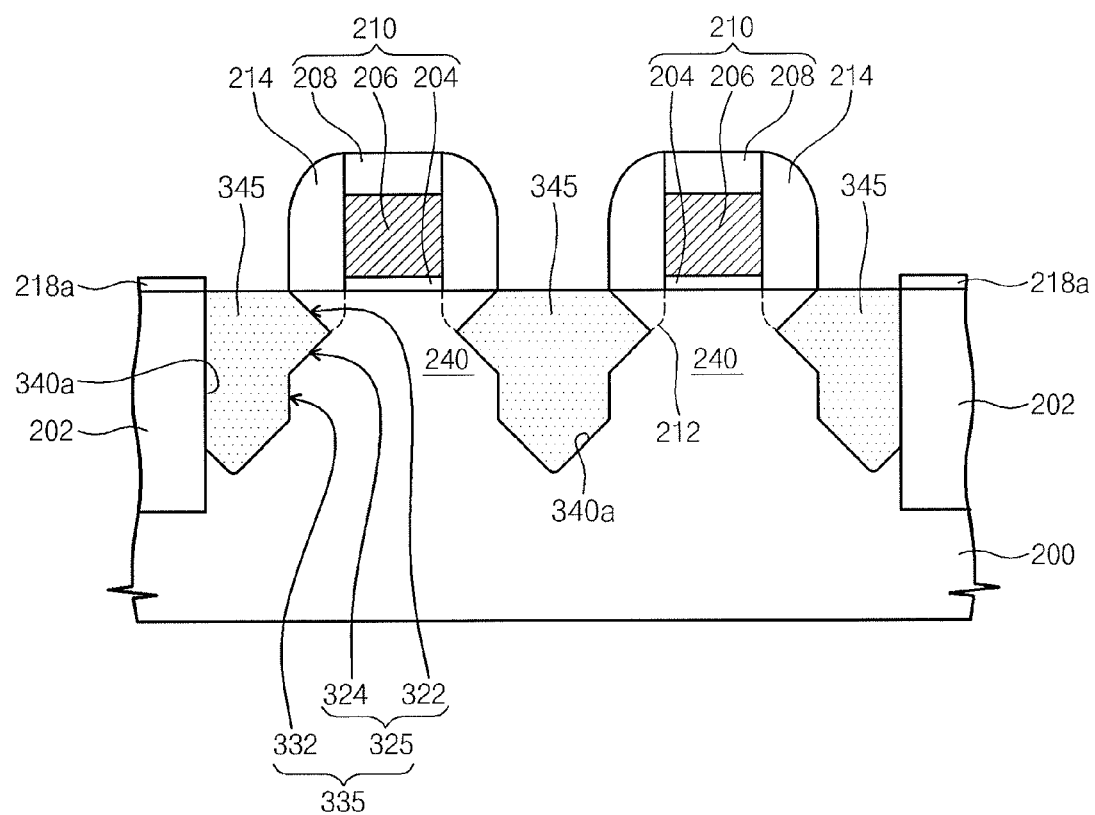

FIGS. 9A to 9C illustrate cross-sectional views relating to an exemplary modification of a method for fabricating a semiconductor device according to another exemplary embodiment.

The method for fabricating the semiconductor device according to this exemplary modification may include the processes described with reference to FIG. 8A.

Referring to FIGS. 8A and 9A, when the width of the bottom surface of a preliminary first concave region 320 is reduced by the scaling down of a semiconductor device, the bottom surface of a first concave region 320b formed through the selective wet etching process may have a tapered shape that tapers toward the bottom surface of a semiconductor substrate 200, as illustrated in the drawings. When the width of the bottom surface of the preliminary first concave region 320 is equal to or smaller than the height of a sidewall of the preliminary first concave region 320, the bottom surface of the first concave region 320b may have the tapered shape.

Referring to FIG. 9B, the gate pattern 210, the spacer 214 and the mask pattern 218a may be used as an etch mask to perform the second anisotropic etching process (which may be identical to the second anisotropic etching process described with reference to FIG. 8C) on the first concave region 320b, thereby forming a second concave region 330a. The first concave region 320b and the second concave region 330a thereunder may constitute a depression region 340a. The shape of the bottom surface of the first concave region 320b may be transferred by the second anisotropic etching process. Accordingly, the shape of the bottom surface of the second concave region 330a may be substantially the same as the shape of the bottom surface of the first concave region 320b of FIG. 9A.

Referring to FIG. 9C, a selective epitaxial growth process may be performed to form epitaxial patterns 345 filling the depression regions 340a respectively. A capping semiconductor pattern 350 of FIG. 7 may be formed on the epitaxial patterns 345 to implement the semiconductor device of FIG. 7.

The semiconductor devices according to the above embodiments may be implemented in various types of semiconductor packages. For example, three-dimensional semiconductor memory devices according to exemplary embodiments of the inventive concept may be packaged in various ways such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

By way of summation and review, the speed of semiconductor devices has recently become higher and higher. Moreover, the integration density of semiconductor devices has become higher and higher. Thus, the size of transistors in semiconductor devices has become smaller and smaller. A decrease in the size of the transistor may cause a decrease in the turn-on current of the transistor. A decrease in the turn-on current of the transistor may cause a decrease in the operation speed of the transistor. A decrease in the operation speed of the transistor, in turn, may cause a decrease in the reliability of the semiconductor device and a decrease in the operation speed of the semiconductor device. The embodiments disclosed herein advance the art by increasing the turn-on current of a transistor in a highly-integrated semiconductor device.

The present disclosure provides a semiconductor device that is optimized for high integration and has high reliability, and a method for fabricating the same. The present disclosure also provides a semiconductor device that can increase the turn-on current of a field effect transistor and a method for fabricating the same. The present disclosure also provides a semiconductor device that can increase the mobility of carriers in the channel of a field effect transistor, and a method for fabricating the same.

According to the semiconductor devices described above, the sidewall of the depression region adjacent to the body may include the inner surfaces of the first and second tapered recesses, or may include the inner surface of the tapered recess and the lower sidewall of the (110) crystal plane thereunder. Accordingly, the epitaxial pattern filling the depression region may provide a sufficient compressive or tensile force to the top and bottom portions of the body. Consequently, a sufficient compressive or tensile force may be provided to the channel region defined in the body, thus increasing the mobility of carriers in the channel region. When the mobility of carriers in the channel region increases, the turn-on current of the field effect transistor increases. Accordingly, it may be possible to implement a semiconductor device that has a high reliability and a high operation speed.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description. Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for fabricating a semiconductor device, comprising:

forming a gate pattern on a semiconductor substrate;

forming a pair of depression regions respectively in the semiconductor substrate at both sides of the gate pattern such that a portion of the semiconductor substrate between the depression regions is defined as a body, such that a sidewall of each depression region adjacent to the body includes an inner surface of a first tapered recess that tapers toward the body and includes an inner surface of a second tapered recess that tapers toward the body and that is disposed under the first tapered recess; and forming a pair of epitaxial patterns respectively filling the pair of the depression regions, wherein each epitaxial pattern includes a semiconductor element different from that of the semiconductor substrate, and each epitaxial pattern fills the respective first and second tapered recesses.

2. The method as claimed in claim 1, wherein the forming of the depression regions comprises:

forming a pair of preliminary depression regions in the semiconductor substrate at both sides of the gate pattern, such that a sidewall of the preliminary depression region adjacent to the body includes a first surface having a (110) crystal plane and a second surface located under the first surface and having a (110) crystal plane, and such that a first horizontal distance between the first surface and the gate pattern is different from a second horizontal distance between the second surface and the gate pattern; and performing a selective wet etching process on the preliminary depression regions to form the depression regions, wherein the selective wet etching process uses {111} crystal planes of the semiconductor substrate as an etch stop surface.

3. The method as claimed in claim 2, wherein the inner surface of the first tapered recess includes a first upper inclined surface and a first lower inclined surface located under the first upper inclined surface;

the inner surface of the second tapered recess includes a second upper inclined surface and a second lower inclined surface located under the second upper inclined surface;

the first and second upper inclined surfaces have a downward slope toward the body;

the first and second lower inclined surfaces have an upward slope toward the body; and crystal planes of the first and second upper inclined surfaces and crystal planes of the first and second lower inclined surfaces are included in {111} crystal planes.

4. The method as claimed in claim 2, wherein the gate pattern has a pair of sides defined by a pair of sidewalls and wherein the forming of a pair of the preliminary depression regions comprises:

forming a spacer on both sidewalls of the gate pattern;

performing a first anisotropic etching process on the semiconductor substrate at both sides of the gate pattern using the gate pattern and the spacer as an etch mask to form first anisotropically-etched regions;

performing an isotropic etching process on the first anisotropically-etched regions to form isotropically-etched regions; and performing a second anisotropic etching process on bottom surfaces of the isotropically-etched regions using the gate pattern and the spacer as an etch mask.

5. The method as claimed in claim 4, wherein the isotropic etching process has a substantially identical etch rate with respect to all crystal planes of the semiconductor substrate.

6. The method as claimed in claim 2, wherein the gate pattern has a pair of sides defined by a pair of sidewalls and wherein the forming of a pair of the preliminary depression regions comprises:

forming a spacer on both sidewalls of the gate pattern;

performing a first anisotropic etching process on the semiconductor substrate at both sides of the gate pattern using the gate pattern and the spacer as an etch mask to form first anisotropically-etched regions;

forming a mask spacer covering the sidewalls of the first anisotropically-etched regions; and performing a second anisotropic etching process on bottom surfaces of the first anisotropically-etched regions using the gate pattern, the spacer on the sidewall of the gate pattern and the mask spacer as an etch mask.

7. A method for fabricating a semiconductor device, comprising:

forming a gate pattern on a semiconductor substrate;

forming a pair of depression regions respectively in the semiconductor substrate at both sides of the gate pattern such that a portion of the semiconductor substrate between the depression regions is defined as a body, and such that a sidewall of each depression region adjacent to the body includes an inner surface of a tapered recess that tapers toward the body and includes a lower sidewall located under the tapered recess, the lower sidewall having a (110) crystal plane; and forming a pair of epitaxial patterns respectively filling the pair of the depression regions, wherein each epitaxial pattern includes a semiconductor element different from that of the semiconductor substrate, and each epitaxial pattern fills the respective tapered recess.

8. The method as claimed in claim 7, wherein the forming of the depression regions comprises:

etching the semiconductor substrate at both sides of the gate pattern to form a pair of preliminary first concave regions;

performing a selective wet etching process on the preliminary first concave regions to form first concave regions, wherein the selective wet etching process uses {111} crystal planes of the semiconductor substrate as an etch stop surface, and each first concave region includes the tapered recess; and performing an anisotropic etching process on bottom surfaces of the first concave regions to form second concave regions, such that each of the second concave regions includes a sidewall that is adjacent to the body and has a (110) crystal plane, and such that the sidewall of each second concave region, which sidewall includes the (110) crystal plane, corresponds to the lower sidewall of the depression region.

9. The method as claimed in claim 8, further comprising forming a spacer on sidewalls of the gate pattern, wherein the preliminary first concave regions are formed by performing a first anisotropic etching process on the semiconductor substrate using the gate pattern and the spacer as an etch mask; and the second concave regions are formed by performing a second anisotropic etching process on the bottom surfaces of the first concave regions using the gate pattern and the spacer as an etch mask.

10. The method as claimed in claim 1, wherein the first tapered recess is recessed into the body and the inner surface of the second tapered recess is recessed into the body.

11. The method as claimed in claim 1, further comprising disposing a capping semiconductor pattern on the pair of epitaxial patterns.

12. The method as claimed in claim 7, wherein the tapered recess is recessed into the body.

13. A method for fabricating a semiconductor device, comprising:
   forming a gate pattern on a semiconductor substrate;
   forming a pair of depression regions respectively in the semiconductor substrate at both sides of the gate pattern such that a portion of the semiconductor substrate between the depression regions is defined as a body, wherein the depression region has opposing sawtooth sidewalls each having at least two tips protruding toward the body; and
   forming a pair of epitaxial patterns respectively filling the pair of the depression regions.

* * * * *